United States Patent [19]
Kono et al.

[11] Patent Number: 5,652,730
[45] Date of Patent: Jul. 29, 1997

[54] SEMICONDUCTOR MEMORY DEVICE HAVING HIERARCHICAL BOOSTED POWER-LINE SCHEME

[75] Inventors: Takashi Kono; Kiyohiro Furutani; Mikio Asakura; Hideto Hidaka, all of Hyogo, Japan

[73] Assignee: Mitsubishi Denki Kabushiki Kaisha, Tokyo, Japan

[21] Appl. No.: 648,607

[22] Filed: May 15, 1996

[30] Foreign Application Priority Data

Jul. 24, 1995 [JP] Japan ................... 7-187160
Nov. 28, 1995 [JP] Japan ................... 7-308991

[51] Int. Cl.$^6$ ............................ G11C 13/00
[52] U.S. Cl. ................ 361/226; 365/189.09
[58] Field of Search .................. 365/226, 227, 365/230.01, 189.09

[56] References Cited

U.S. PATENT DOCUMENTS 5,579,276 11/1996 Yoon et al. ............... 365/226

FOREIGN PATENT DOCUMENTS 63-61495 3/1988 Japan.
5-210976 8/1993 Japan.

*Primary Examiner*—Terrell W. Fears
*Attorney, Agent, or Firm*—Lowe, Price, LeBlanc & Becker

[57] ABSTRACT

A DRAM includes an internal boosting circuit, a global power-line, a plurality of blocks, a row decoder, and a POR generating circuit. Each block includes word lines, local power-lines, AND gates, drive transistors, and word line drivers. The AND gate turns a corresponding drive transistor on/off in response to a power on reset signal /POR and a corresponding block select signal. Therefore, all the local boosted power-lines are connected to the global boosted power-line during a power on reset period, whereby all the local boosted power-lines are initially charged up to boosted power supply potential Vpp.

19 Claims, 29 Drawing Sheets

SEMICONDUCTOR MEMORY DEVICE HAVING HIERARCHICAL BOOSTED POWER-LINE SCHEME

BACKGROUND OF THE INVENTION

1. Field of the Invention

The present invention relates to semiconductor memory devices, and more particularly, to improvement of a semiconductor memory device having a hierarchical boosted power-line scheme.

2. Description of the Background Art

In recent years, a semiconductor memory device is used in a variety of portable appliances. A battery is generally used as a power source of such a portable appliance. In order to use a portable appliance for a long time with one battery, it is necessary to suppress as much as possible current consumption not only at the time of operation but also at stand-by. Therefore, reduction of power consumption of a semiconductor memory device is very important.

In a dynamic random access memory (DRAM) which is a typical semiconductor memory device, for example, a word line is boosted to a potential higher than a power supply potential Vcc (hereinafter referred to as a "boosted power supply potential Vpp") in order to store an H (logical high) level which is completely equal to the power supply potential Vcc in a memory cell.

FIG. 30 is a block diagram showing an internal boosting circuit and a word line driving circuit (word line driver) used in the DRAM in recent years. Referring to FIG. 30, an internal boosting circuit 20 generates, based on the externally supplied power supply potential Vcc, the boosted power supply potential Vpp higher than the power supply potential Vcc. A word line driver WD is activated/deactivated in response to a decode signal from a decoder unit DU. Word line driver WD is constituted of a CMOS invertor including a P channel MOS transistor Q1 and an N channel MOS transistor Q2. Decoder unit DU and word line driver WD are supplied with the boosted power supply potential Vpp from internal boosting circuit 20.

Word line driver WD in a stand-by state is shown in FIG. 30. In the stand-by state, a decode signal at the H level which is equal to the boosted power supply potential Vpp is supplied to word line driver WD from decoder unit DU, causing P channel MOS transistor Q1 to be turned off and N channel MOS transistor Q2 to be turned on. Therefore, the potential of a word line WL is brought to an L (logical low) level which is equal to a ground potential (0V) by N channel MOS transistor Q2.

On the other hand, when word line driver WD is in an operating state and the word line is selected, a decode signal at the L level is supplied to word line driver WD from decoder unit DU, causing P channel MOS transistor Q1 to be turned on and N channel MOS transistor Q2 to be turned off. Therefore, the boosted power supply potential Vpp is supplied to word line WL through P channel MOS transistor Q1, whereby word line WL is boosted up to the boosted power supply potential Vpp. Since word line driver WD requires a large driving capability in order to drive word line WL, the channel width of P channel MOS transistor Q1 of word line driver WD is set wider than those of the other transistors used in a peripheral circuit.

Generally, although P channel MOS transistor Q1 is in an off state in the stand-by state, a small through current i called a subthreshold current flows from the source to the drain in P channel MOS transistor Q1. The through current i supplied in word line driver WD becomes larger than those in the other transistors used in the peripheral circuit.

Since a 64 M-bit DRAM, for example, includes 32K word lines and 32K word line drivers in total, the sum of the through currents becomes extremely large. As a result, the output potential of internal boosting circuit 20 is decreased from the predetermined boosted power supply potential Vpp. Internal boosting circuit 20 operates in order to bring the decreased output potential back to the original boosted power supply potential. A current flows in from an external power source for this operation of internal boosting circuit 20, thereby increasing current consumption.

A hierarchical boosted power-line scheme in which a plurality of word line drivers are divided into several blocks and the boosted power-lines are made hierarchical in order to reduce such power consumption at stand-by as described above is suggested in "Subthreshold-Current Reduction Circuits for Multi-Gigabit DRAM's," Symposium on VLSI Circuits, *Digests of Technical Papers*, (1993): 45 and 46. FIG. 31 shows one block of a hierarchical boosted power-line scheme suggested in this article. Referring to FIG. 31, the boosted power supply potential Vpp from internal boosting circuit 20 is directly supplied to a global boosted power-line GPL, and further supplied to a local boosted power-line LPL through a block select transistor BST. By local boosted power-line LPL, n word line drivers WD1 to WDn are connected together. Each of the other blocks (not shown) includes one drive transistor, one local boosted power-line, and n word line drivers, similarly to the block shown in FIG. 31. Therefore, one global boosted power-line GPL shown in FIG. 31 is connected to the local boosted power-line through the drive transistor in each block.

In operation, a block select signal /BS at the L level (in this specification and the drawings, "/" before a signal indicates that the signal is at a negative logical level) is applied to select transistor BST, whereby local boosted power-line LPL is supplied with the boosted power supply potential Vpp. Simultaneously, only one decoder unit selected among n decoder units DU1 to Dun supplies a decode signal at the L level to a corresponding word line driver. Therefore, only one word line driver selected among n word line drivers WD1 to WDn is activated, and the boosted power supply potential Vpp is supplied to a corresponding word line through P channel MOS transistor Q1 in the activated word line driver. Word lines WL1 to WLn have parasitic capacitances C1 to Cn, respectively. As described above, since only one word line driver is activated in one block, it is enough for select transistor BST to have a capability to drive one word line.

On the other hand, at stand-by, all decoder units DU1 to Dun supply decode signals X1 to Xn at the H level to word line drivers WD1 to WDn, respectively. Therefore, all P channel MOS transistors Q1 in word line drivers WD1 to WDn are turned off. Simultaneously, block select signal /BS attains the H level. Therefore, the through currents in these P channel MOS transistors Q1 are limited by select transistor BST, resulting in suppression of the through current at stand-by as a whole.

Although the potential of local boosted power-line LPL is decreased from the boosted power supply potential Vpp, each P channel MOS transistor Q1 is supplied with the boosted power supply potential Vpp at its gate, and therefore, the gate-to-source voltage of P channel MOS transistor Q1 becomes negative. As a result, when the through current flowing in each word line driver reaches 1/n the through current flowing in a drive transistor DT, the potential of local boosted power-line LPL stops decreasing, and is stable at a potential Vpps a little lower than the boosted power supply potential Vpp.

When drive transistor DT is not included and the boosted power supply potential Vpp is always supplied to all the word line drivers, the above through current i flows in each word line driver. On the other hand, in the case of such a hierarchical boosted power-line scheme as described above, only 1/n the through current i flows in each word line driver. Therefore, the sum of the through currents is substantially reduced, which in turn reduces current consumption at stand-by. Further, since a voltage drop (Vpp–Vpps) of local boosted power-line LPL when the semiconductor memory device transitions from the operating state to the stand-by state is small, the potential of local boosted power-line LPL is brought back to the boosted power supply potential Vpp immediately when the semiconductor memory device is again brought to the operating state.

In the above described hierarchical boosted power-line scheme, local boosted power-line LPL is discharged at the time of power on. Local boosted power-line LPL is not charged unless a block including the boosted power-line LPL is selected. Since local boosted power-line LPL starts to be charged when the block is selected, word line drivers WD1 to WDn cannot operate normally unless the local boosted power-line LPL is sufficiently charged up to the boosted power supply potential Vpp. Therefore, it takes time from power on to the start of operation of the DRAM. More specifically, in the hierarchical boosted power-line scheme, an insufficient initial charge of local boosted power-line LPL results in a slow initial access immediately after power on.

SUMMARY OF THE INVENTION

One object of the present invention is to provide a semiconductor memory device having a hierarchical boosted power-line scheme operable immediately after power on.

Another object of the present invention is to provide a semiconductor memory device whose boosted power supply potential at the start of operation is sufficiently compensated.

Still another object of the present invention is to provide a semiconductor memory device whose boosted power supply potential at the start of operation attains a predetermined level.

A further object of the present invention is to provide a semiconductor memory device which can switch from a hierarchical boosted power-line scheme to an ordinary scheme in a test mode.

A further object of the present invention is to provide a semiconductor memory device having a hierarchical boosted power-line scheme applied to a transistor for bit line separation in a shared sense amplifier.

According to one aspect of the present invention, the semiconductor memory device includes a boosted power supply potential generating circuit, a global power-line, a plurality of word lines, a plurality of bit lines, a plurality of memory cells, a local power-line, a connecting element, a plurality of word line driving circuits, an activating circuit, and a power on reset signal generating circuit. The boosted power supply potential generating circuit generates, based on an external power supply potential, a predetermined boosted power supply potential higher than the external power supply potential. The global power-line is supplied with the boosted power supply potential from the boosted power supply potential generating circuit. The plurality of bit lines cross the word lines. The plurality of memory cells are provided corresponding to crossing points of the word lines and the bit lines. Each of the memory cells is connected to a corresponding word line and a corresponding bit line. The connecting element connects the local power-line to the global power-line in response to a predetermined select signal. The plurality of word line driving circuits are provided corresponding to the word lines, and connected together to the local power-line. Each of the word line driving circuits supplies the boosted power supply potential of the local power-line to a corresponding word line to drive the corresponding word line. The activating circuit selectively activates the word line driving circuits in response to an externally supplied row address signal. The power on reset signal generating circuit generates a power on reset signal for a predetermined period in response to supply of the external power supply potential. The connecting element further connects the local power-line to the global power-line in response to the power on reset signal.

In the above described semiconductor memory device, since the local power-line is connected to the global power-line in response to the power on reset signal, the boosted power supply potential is supplied to the local power-line before the word line driving circuits start to drive the word lines. Therefore, the semiconductor memory device can start operating immediately after power on.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
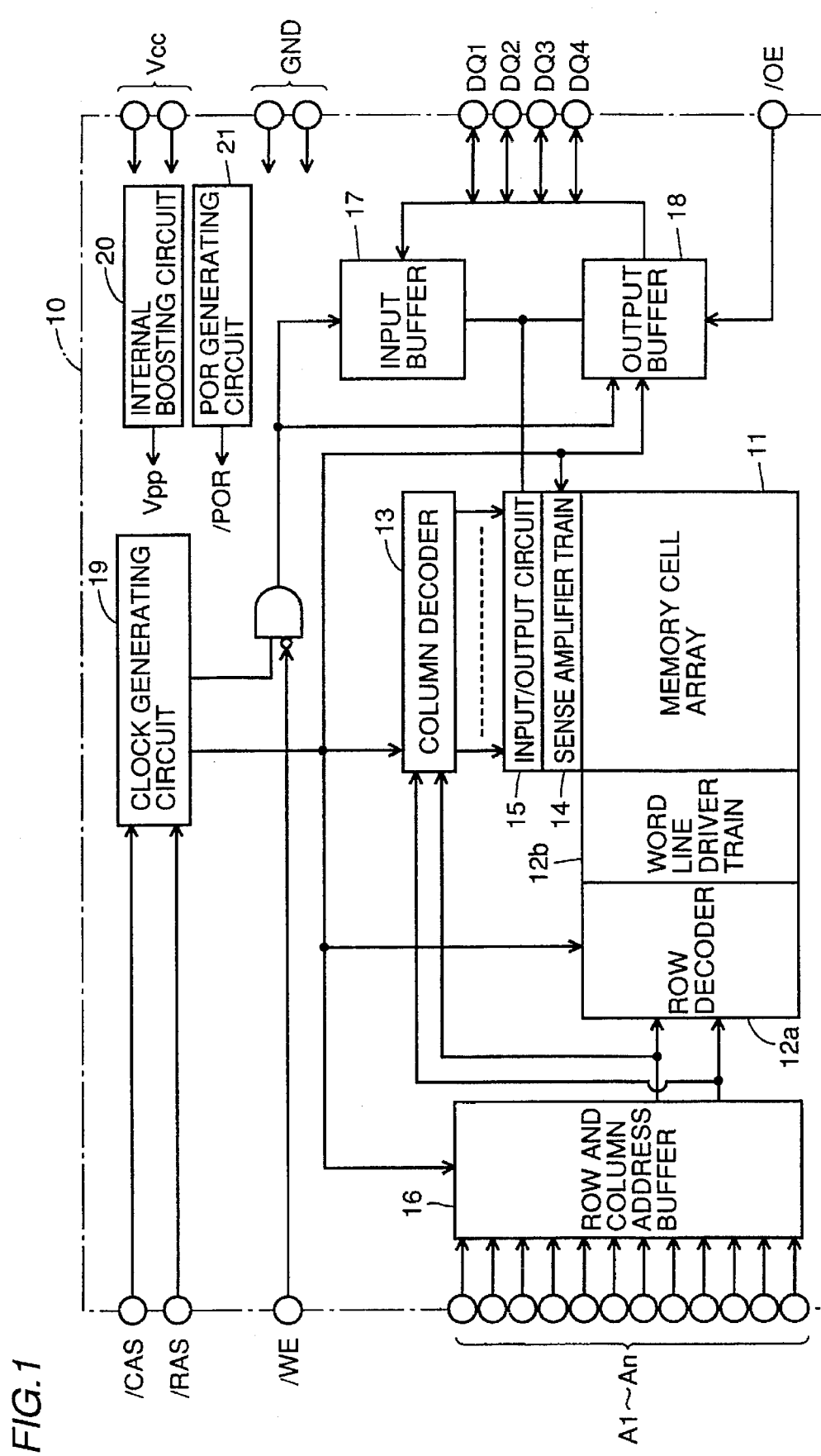
FIG. 1 is a block diagram showing the whole structure of a DRAM according to Embodiment 1 of the present invention.

Embodiments of the present invention will be described in detail hereinafter with reference to the drawings. In the drawings, the same reference characters denote the same or corresponding portions.

Embodiment 1

Referring to FIG. 1, a DRAM is formed on one semiconductor substrate 10. The DRAM includes a memory cell array 11, a row decoder 12a, a word line driver train 12b, a column decoder 13, a sense amplifier train 14, an input/output circuit 15, a row and column address buffer 16, an input buffer 17, an output buffer 18, a clock generating circuit 19, an internal boosting circuit 20, and a power on reset (POR) generating circuit 21.

Figure 2:
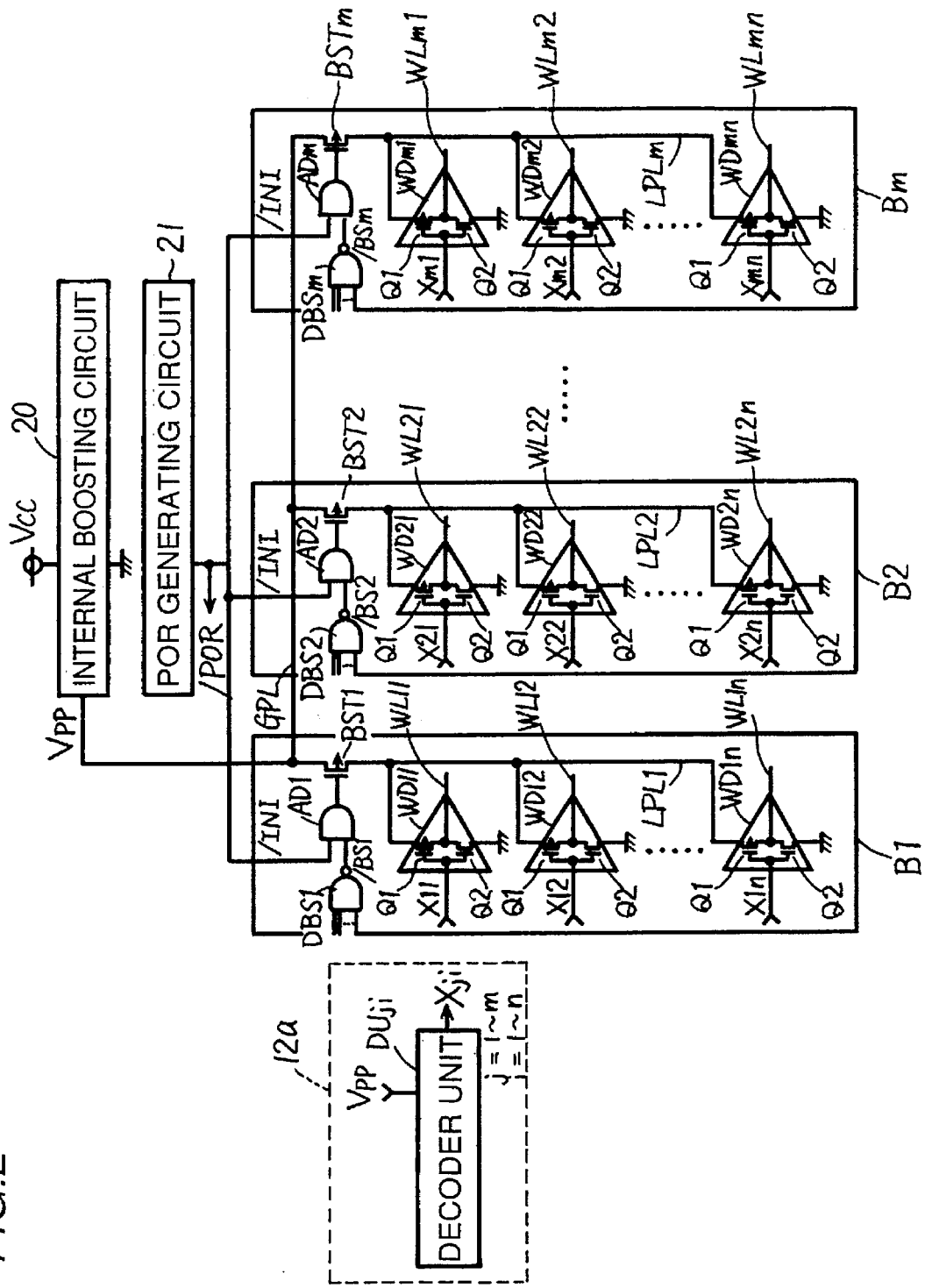
FIG. 2 is a block diagram showing a blocked structure of a row decoder and a word line driver train together with an internal boosting circuit and a POR generating circuit in FIG. 1.

Referring to FIG. 2, the DRAM further includes a global boosted power-line GPL. Internal boosting circuit 20 generates, based on externally supplied power supply potential Vcc, a predetermined boosted power supply potential Vpp higher than the power supply potential Vcc, and supplies the potential Vpp to global boosted power-line GPL. POR generating circuit 21 generates a power on reset signal /POR only for a predetermined period in response to supply of the power supply potential Vcc in order to deactivate the internal circuitry of the DRAM until the power supply potential Vcc attains a predetermined level after power on.

Each block Bj (j=1 to m) includes a block select decoder DBSj, an AND gate ADj, a block select transistor BSTj, a local boosted power-line LPLj, n word line drivers WDj1 to WDjn, and n word lines WLj1 to WLjn. Block select decoder DBSj is formed of an NAND gate, and applies a block select signal /BSj to a corresponding AND gate ADj in response to a row address signal. AND gate ADj turns select transistor BSTj on/off in response to block select signal /BSj and power on reset signal /POR applied as an initialize signal /INI. Select transistor BSTj is connected between global boosted power-line GPL and local boosted power-line LPLj, and supplies the boosted power supply potential Vpp to local boosted power-line LPLj in response to the output of AND gate ADj.

Each of word line drivers WDj1 to WDjn is configured of a CMOS invertor including P channel MOS transistor Q1 and N channel MOS transistor Q2. Word line drivers WDj1 to WDjn are activated in response to decode signals Xj1 to Xjn to drive word lines WLj1 to WLjn. These decode signals Xj1 to Xjn are generated by row decoder 12a.

Row decoder 12a includes (m×n) decoder units DUji (j=1 to m, i=1 to n). Decoder unit DUji brings a corresponding decode signal Xji to the L level in response to the row address signal. Therefore, only one of word line drivers WDj1 to WDjn is activated.

Figure 3:
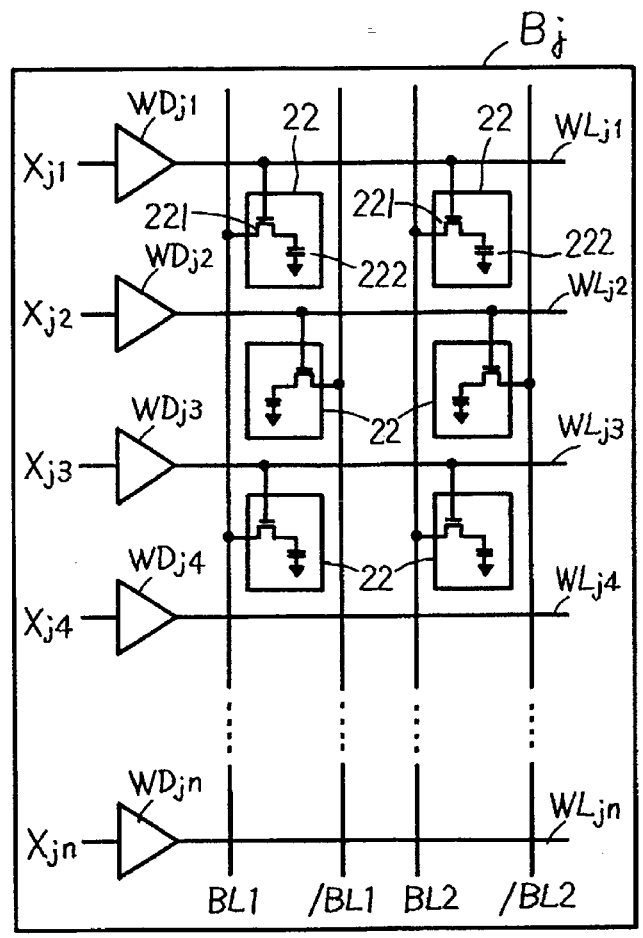
FIG. 3 is a block diagram showing a structure of the word line driver train and a memory cell array in one block shown in FIG. 2.

Referring to FIG. 3, each block includes a plurality of bit line pairs BL1, /BL1, BL2, /BL2, . . . , crossing word lines WLj1 to WLjn, and a plurality of memory cells 22 provided corresponding to crossing points of the word lines and the bit line pairs. Bit line pair BL1, /BL1 is configured of a bit line BL1 and a bit line /BL1 complementary to bit line BL1. The other bit line pairs are configured similarly. Each memory cell 22 includes a transfer gate 221 and a cell capacitor 222. Transfer gate 221 is connected between a corresponding bit line and cell capacitor 222, with its gate connected to a corresponding word line.

Referring again to FIG. 1, sense amplifier train 14 amplifies potential differences of the bit line pairs in memory cell array 11. In response to a column address signal, column decoder 13 selects any of the bit line pairs in memory cell array 11. Input/output circuit 15 connects a bit line pair selected by column decoder 13 to input buffer 17 or output buffer 18.

Row and column address buffer 16 supplies externally applied address signals A1 to An to row decoder 12a as row address signals, or to column decoder 13 as column address signals. Input buffer 17 supplies externally applied input/output data DQ1 to DQ4 to input/output circuit 15. Output buffer 18 provides data from input/output circuit 15 as input/output data DQ1 to DQ4 in response to an output enable signal /OE. Clock generating circuit 19 generates various internal control signals in response to a row address strobe signal /RAS, a column address strobe signal /CAS and the like.

Figure 4:
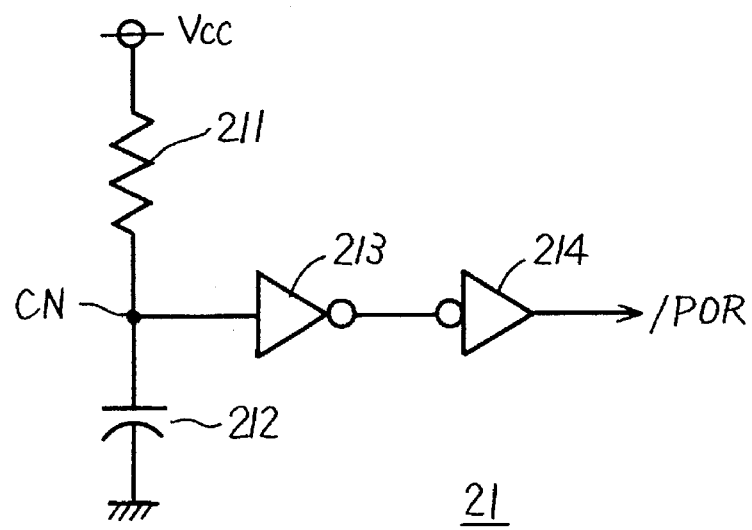
FIG. 4 is a circuit diagram showing a specific structure of the POR generating circuit in FIGS. 1 and 2.

Referring to FIG. 4, POR generating circuit 21 includes a resistance element 211 connected between a power supply node supplied with the power supply potential Vcc and a charge node CN, a capacitor element 212 connected between charge node CN and a ground node, and inverters 213 and 214 connected in series.

POR generating circuit 21 operates as follows. Upon power on, the potential of the power supply node increases from the ground potential to the power supply potential Vcc. As a result, capacitor element 212 is charged, and invertor 214 generates power on reset signal /POR at the L level until the potential of charge node CN exceeds the logical threshold value of invertor 213. When the potential of charge node CN exceeds the logical threshold value, power on reset signal /POR is deactivated from the L level to the H level. The internal circuit in the DRAM is deactivated in response to this power on reset signal at the L level.

Operation of the DRAM according to Embodiment 1 will now be described. Upon power on, power on reset signal /POR at the L level is generated by POR generating circuit 21. Power on reset signal /POR at the L level is supplied to the internal circuitry of the DRAM to deactivate the internal circuitry. Simultaneously, power on reset signal /POR is supplied to AND gates AD1 to ADm in all blocks B1 to Bm as initialize signal /INI. AND gates AD1 to ADm turn on select transistors BST1 to BSTm in all blocks B1 to Bm in response to initialize signal /INI at the L level. Since global boosted power-line GPL is supplied with the internal boosted power supply potential Vpp generated by internal boosting circuit 20, this internal boosted power supply potential Vpp is supplied to all local boosted power-lines LPL1 to LPLm through respective select transistors BST1 to BSTm. As a result, local boosted power-lines LPL1 to LPLm are charged toward the boosted power supply potential Vpp.

When the power supply potential Vcc increases sufficiently, power on reset signal /POR is deactivated from the L level to the H level. This deactivates initialize signal /INI from the L level to the H level, causing AND gates AD1 to ADm to turn select transistors BST1 to BSTm off, respectively. As a result, initial charge of local boosted power-lines LPL1 to LPLm in the power on reset period is completed.

In response to the row address signal, block select decoders DBS1 to DBSm activate only one of block select signals /BS1 to /BSm to the L level. Simultaneously, row decoder 12a brings one of decode signals Xj1 to Xjn to the L level. When only block select signal /BS1 attains the L level and only decode signal X11 attains the L level, for example, only word line driver WD11 in block B1 is activated. Since the other block select signals /BS2 to /BSm are at the H level, word line drivers WD21 to WDmn in the other blocks B2 to Bm all remain deactivated. Since the other decode signals Xj2 to Xjn are at the H level, the other word line drivers WD12 to WD1n in block B1 also remain deactivated.

When block select signal /BS1 is activated to the L level, select transistor BST1 is turned on. Therefore, the boosted power supply potential Vpp of global boosted power-line GPL is supplied to local boosted power-line LPL1. However, since local boosted power-line LPL1 is already charged to the boosted power supply potential Vpp in Embodiment 1, word line driver WD11 immediately supplies the boosted power supply potential Vpp to corresponding word line WL11 to drive the word line WL11, without waiting for the boosted power supply potential Vpp to be supplied from global boosted power-line GPL to local boosted power-line LPL1 in response to block select signal /BS1.

Since all local boosted power-lines LPL1 to LPLm are charged to the boosted power supply potential Vpp immediately after power on, even if any of word line drivers WD11 to WDmn is activated, a corresponding word line may be activated immediately. Once local boosted power-lines LPL1 to LPLm are charged, they are recharged during accessing and refreshing thereafter. Therefore, these local boosted power-lines LPL1 to LPLm are always maintained in a charged state.

As described above, according to Embodiment 1, since all local boosted power-lines LPL1 to LPLm are charged in response to power on reset signal /POR, the word line drivers can drive the word lines immediately after the power on reset period. Therefore, the DRAM can operate immediately after power on. Further, only by adding AND gates AD1 to ADm to the conventional structure, a DRAM operable immediately after power on can be implemented.

Embodiment 2

In the above described Embodiment 1, local boosted power-lines LPL1 to LPLm are initially charged using power on reset signal /POR. However, a case is considered where local boosted power-lines LPL1 to LPLm are not sufficiently charged up to the boosted power supply potential Vpp during the power on reset period. The object of Embodiment 2 to be described hereinafter is to provide a DRAM which can initially charge local boosted power-lines LPL1 to LPLm up to the boosted power supply potential Vpp sufficiently during a period from power on to the start of operation.

Figure 5:
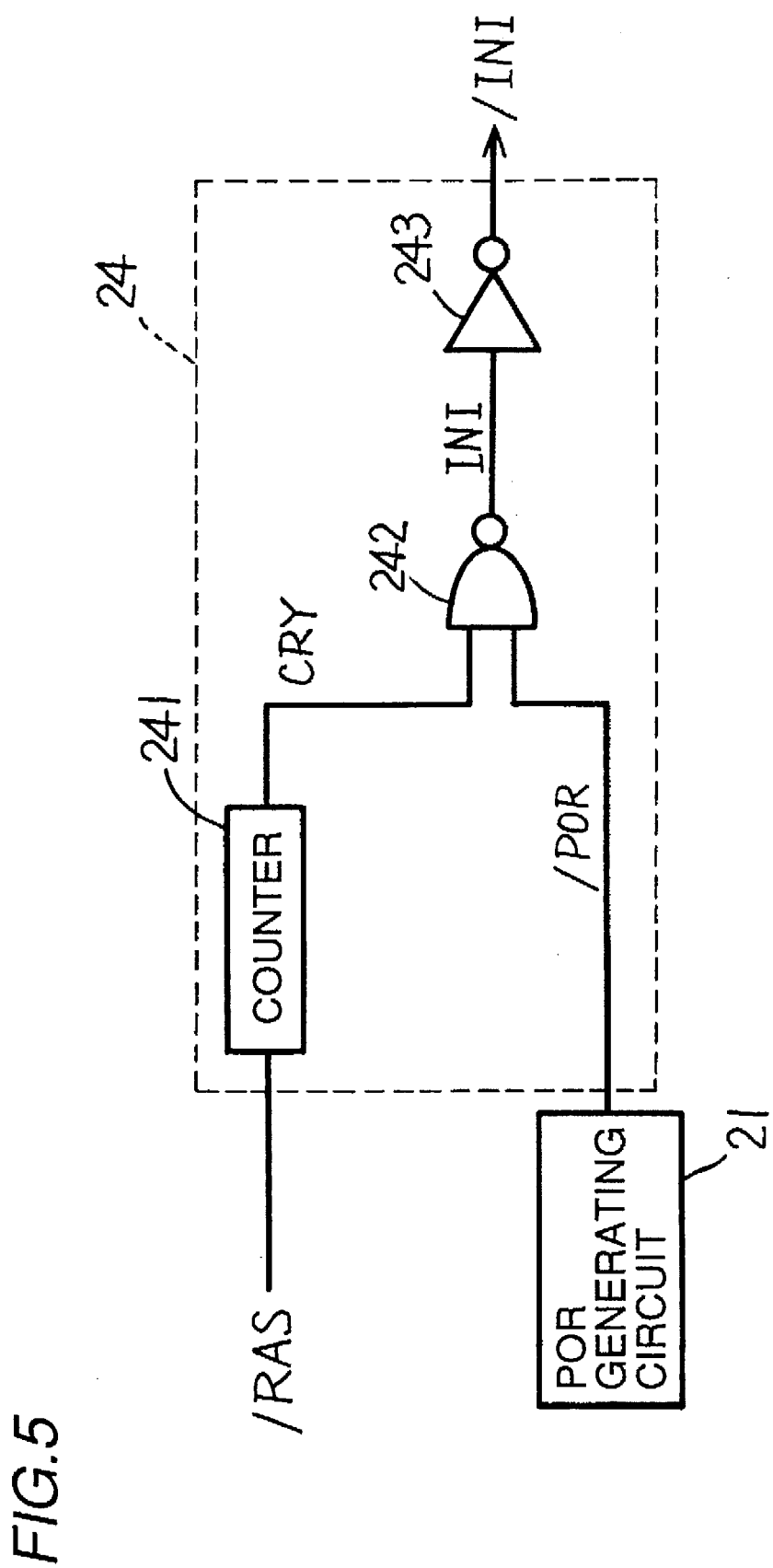
FIG. 5 is a block diagram showing a main structure of a DRAM according to Embodiment 2 of the present invention.

Referring to FIG. 5, a DRAM according to Embodiment 2 includes a delay circuit 24 in addition to the components of the DRAM of Embodiment 1. Delay circuit 24 holds initialize signal /INI in an active state for a prescribed period even after rising (deactivation) of power on reset signal /POR from POR generating circuit 21, and supplies initialize signal /INI to AND gates AD1 to ADm in blocks B1 to Bm shown in FIG. 2. Initialize signal /INI is further supplied to the internal circuitry connected directly to external signal pins to which various signals are externally supplied, and the internal circuitry is deactivated in response to the supplied initialize signal /INI. As a result, the DRAM will not operate erroneously even if the external signal pins are supplied with unnecessary signals during such an initialize period.

Referring to FIG. 5, delay circuit 24 includes a counter 241 counting row address strobe signal /RAS, an NAND gate 242 generating an initialize signal INI in response to a carry signal CRY from counter 241 and power on reset signal /POR from POR generating circuit 21, and an invertor 243 generating initialize signal /INI by inverting initialize signal INI from NAND gate 242. A predetermined number (here "8") is set to counter 241, and when the number of applied row address strobe signals /RAS reaches the predetermined number, carry signal CRY is activated to the H level.

Operation of delay circuit 24 will now be described with reference to a timing chart of FIG. 6. Upon power on at time t=0, POR generating circuit 21 generates power on reset signal /POR at the L level as shown at (b) of FIG. 6. Since power on reset signal /POR is then applied to NAND gate 242, invertor 243 generates initialize signal /INI at the L level as shown at (d) of FIG. 6. After a prescribed time from power on, power on reset signal /POR is deactivated from the L level to the H level as shown at (b) of FIG. 6. When row address strobe signal /RAS is toggled eight times as shown at (a) of FIG. 6 after deactivation of power on reset signal /POR, counter 241 applies carry signal CRY at the H level to NAND gate 242 as shown at (c) of FIG. 6. Since NAND gate 242 receives signals CRY and /POR both at the H level, initialize signal /INI generated by invertor. 243 is deactivated from the L level to the H level as shown at (d) of FIG. 6. Therefore, the internal circuitry connected directly to the external signal pins is activated.

In Embodiment 2, initialize signal /INI generated by delay circuit 24 instead of power on reset signal /POR in Embodiment 1 is applied to AND gates AD1 and ADm shown in FIG. 2. Therefore, similarly to the case of Embodiment 1, upon power on, initial charge of local boosted power-lines LPL1 to LPLm is started. However, in Embodiment 2, the initial charge is not completed but continued even if power on reset signal /POR is deactivated, unlike the case of Embodiment 1. When row address strobe signal /RAS is toggled eight times, the initial charge is completed.

Therefore, according to Embodiment 2, the local boosted power-lines are charged after power on for a period longer than that of Embodiment 1. Therefore, the local boosted power-lines may be sufficiently charged up to the boosted power supply potential before the word line drivers operate. As a result, the DRAM according to Embodiment 2 can operate accurately even immediately after power on. Further, since initialize signal /INI is deactivated according to the number of times of toggle operation of externally applied row address strobe signal /RAS, the initial charge time for the local boosted power-lines can be changed freely.

Embodiment 3

The local boosted power-lines are initially charged using power on reset signal /POR in Embodiment 1, and using an initialize signal which is maintained in an active state only for a predetermined period after deactivation of power on reset signal /POR in Embodiment 2. However, the boosted power supply potential Vpp does not always attain a predetermined level within such a predetermined period. If initial charge of the local boosted power-lines is completed before the boosted power supply potential Vpp attains a predetermined level, the word line drivers, even if activated immediately after power on, cannot supply sufficient boosted power supply potential Vpp to the word lines immediately. The object of Embodiment 3 to be described hereinafter is to provide a DRAM which can boost the word lines to full boosted power supply potential Vpp immediately after power on.

Figure 7:
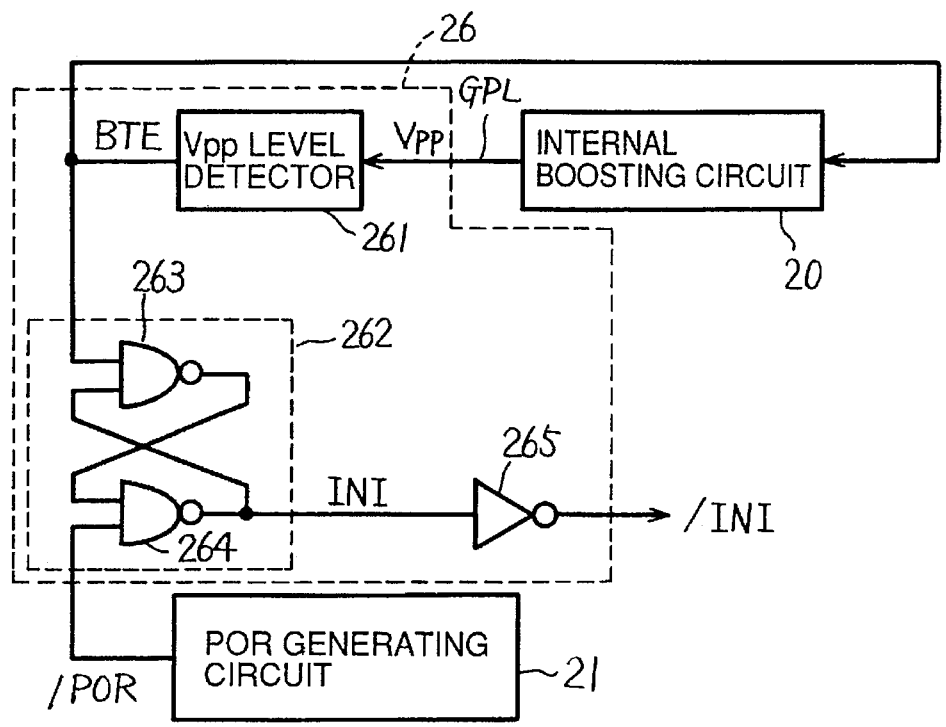
FIG. 7 is a block diagram showing a main structure of a DRAM according to Embodiment 3 of the present invention.

Referring to FIG. 7, a DRAM according to Embodiment 3 includes a delay circuit 26 in addition to the components of the DRAM of Embodiment 1. Delay circuit 26 delays a rising (deactivation) timing of power on reset signal /POR until the potential of global boosted power-line GPL attains a predetermined boosted power supply potential Vpp, thereby supplying generated initialize signal /INI to AND gates AD1 to ADm in blocks B1 to Bm shown in FIG. 2.

Delay circuit 26 includes a boosted power supply potential (Vpp) level detector 261, an RS flip-flop 262 and an invertor 265. Vpp level detector 261 detects the potential supplied to global boosted power-line GPL, and when the detected potential is lower than a predetermined boosted power supply potential Vpp, Vpp level detector 261 generates a boost enable signal BTE at the H level. On the other hand, when the detected potential is equal to or higher than the predetermined boosted power supply potential Vpp, Vpp level detector 261 generates boost enable signal BTE at the L level. Internal boosting circuit 20 is activated in response to boost enable signal BTE at the H level.

RS flip-flop circuit 262 includes NAND gates 263 and 264 coupled to each other. RS flip-flop 262 is set in response to power on reset signal /POR at the L level and reset in response to boost enable signal BTE at the L level. Invertor 265 inverts initialize signal INI output from RS flip-flop circuit 262 to generate initialize signal /INI.

Operation of delay circuit 26 will now be described with reference to a timing chart of FIG. 8. Upon power on at time t=0, power on reset signal /POR at the L level is generated as shown at (a) of FIG. 8. In response to power on reset signal /POR at the L level, RS flip-flop circuit 262 is set, thereby providing initialize signal INI at the H level. As a result, invertor 265 generates initialize signal /INI at the L level as shown at (d) of FIG. 8.

Figure 8:
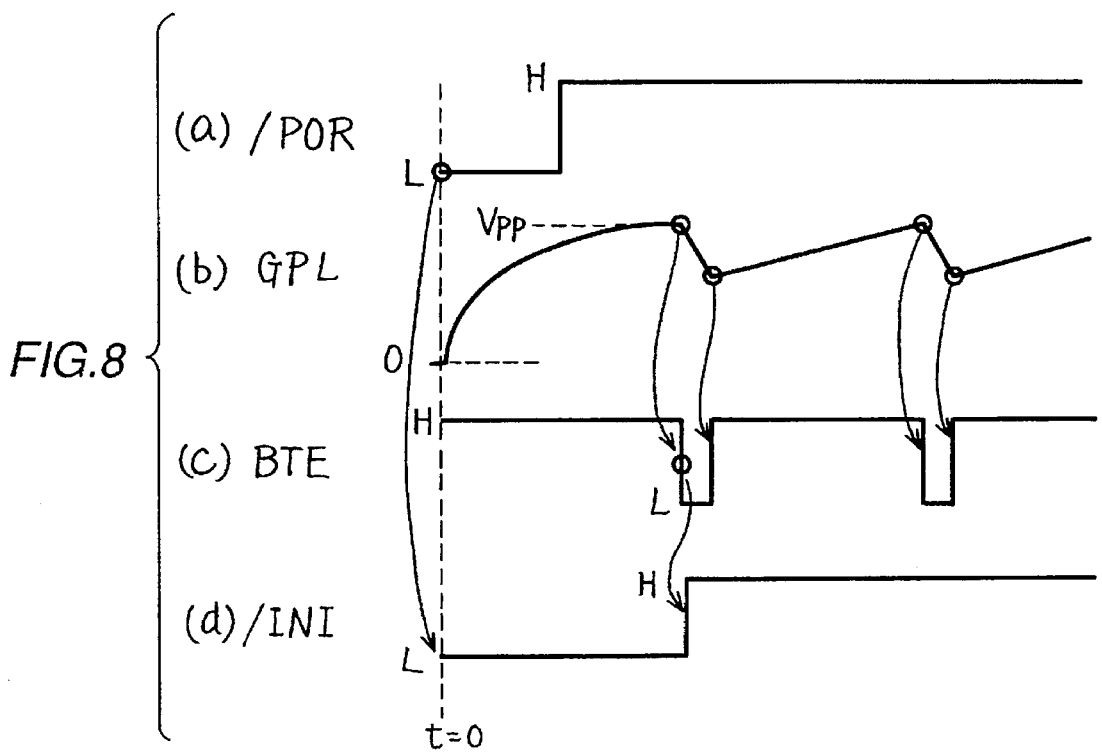
FIG. 8 is a timing chart showing operation of a delay circuit in the DRAM shown in FIG. 7.

Since the potential of global boosted power-line GPL does not yet attain the predetermined boosted power supply potential Vpp immediately after power on as shown at (b) of FIG. 8, level detector 261 generates boost enable signal BTE at the H level as shown at (c) of FIG. 8. Therefore, internal boosting circuit 20 is activated, and the potential of global boosted power-line GPL increases toward the predetermined boosted power supply potential Vpp as shown at (b) of FIG. 8.

Since initialize signal /INI at the L level from delay circuit 26 is applied to AND gates AD1 to ADm shown in FIG. 2, the potential of global boosted power-line GPL is supplied to all the local boosted power-lines. As a result, all the local boosted power-lines are charged towards the predetermined boosted power supply potential Vpp.

Then, as shown at (a) of FIG. 8, power on reset signal /POR is deactivated from the L level to the H level. However, initialize signal /INI is maintained at the L level as shown at (d) of FIG. 8 by a latch function of RS flip-flop circuit 262. Therefore, even after the power on reset period, the initial charge of the local boosted power-lines is continuously carried out.

When the potential of global boosted power-line GPL attains the predetermined boosted power supply potential Vpp as shown at (b) of FIG. 8, level detector 261 detects this, and deactivates boost enable signal BTE from the H level to the L level as shown at (c) of FIG. 8. In response to boost-enable signal BTE at the L level, RS flip-flop circuit 262 is reset, whereby initialize signal /INI is deactivated from the L level to the H level as shown at (d) of FIG. 8. Although initial charge of the local boosted power-lines is completed in response to initialize signal /INI at the H level, the potential of global boosted power-line. GPL already attains the predetermined boosted power supply potential Vpp at this time. Therefore, the potentials of all the local boosted power-lines also attain the predetermined boosted power supply potential Vpp. As a result, the word line drivers can supply full boosted power supply potential Vpp to the word lines immediately after power on.

Further, level detector 261 has a predetermined hysteresis. When the potential of global boosted power-line GPL decreases from the predetermined boosted power supply potential Vpp by a predetermined threshold value or more, level detector 261 again activates boost enable signal BTE to the H level as shown at (c) of FIG. 8. As a result, internal boosting circuit 20 is activated again, and the potential global boosted power-line GPL again increases towards the boosted power supply potential Vpp as shown at (b) of FIG. 8. As described above, boost enable signal BTE changes to the H level whenever the potential of global boosted power-line GPL decreases from the boosted power supply potential Vpp by a predetermined threshold value. However, once the potential of global boosted power-line GPL reaches the boosted power supply potential Vpp, the output of flip-flop circuit 262 does not change irrespective of change of boost enable signal BTE. Therefore, initialize signal /INI is always maintained at the H level, and the local boosted power-lines will not be recharged inadvertently after completion of initial charge. As a result, power will not be consumed unnecessarily.

As described above, according to Embodiment 3, since initial charge of the local boosted power-lines is completed when level detector 261 detects that the potential of global boosted power-line GPL has attained the predetermined boosted power supply potential Vpp, the semiconductor memory device can operate accurately even immediately after power on. Further, since initialize signal /INI is generated using RS flip-flop circuit 262 which is set in response to power on reset signal /POR and reset in response to boost enable signal BTE, charge of the local boosted power-lines will not be resumed inadvertently after completion of initial charge of the local boosted power-lines. As a result, unnecessary power consumption is prevented.

For example, initialize signal /INI from delay circuit 24 of Embodiment 2 may be supplied as a set signal of flip-flop circuit 262 of Embodiment 3. More specifically, Embodiment 2 may be combined with Embodiment 3. Further, although a plurality of blocks are provided and one local boosted power-line is provided in each block in the above embodiments, only one block may be provided and one local boosted power-line may be provided as a whole.

Embodiment 4

Figure 9:
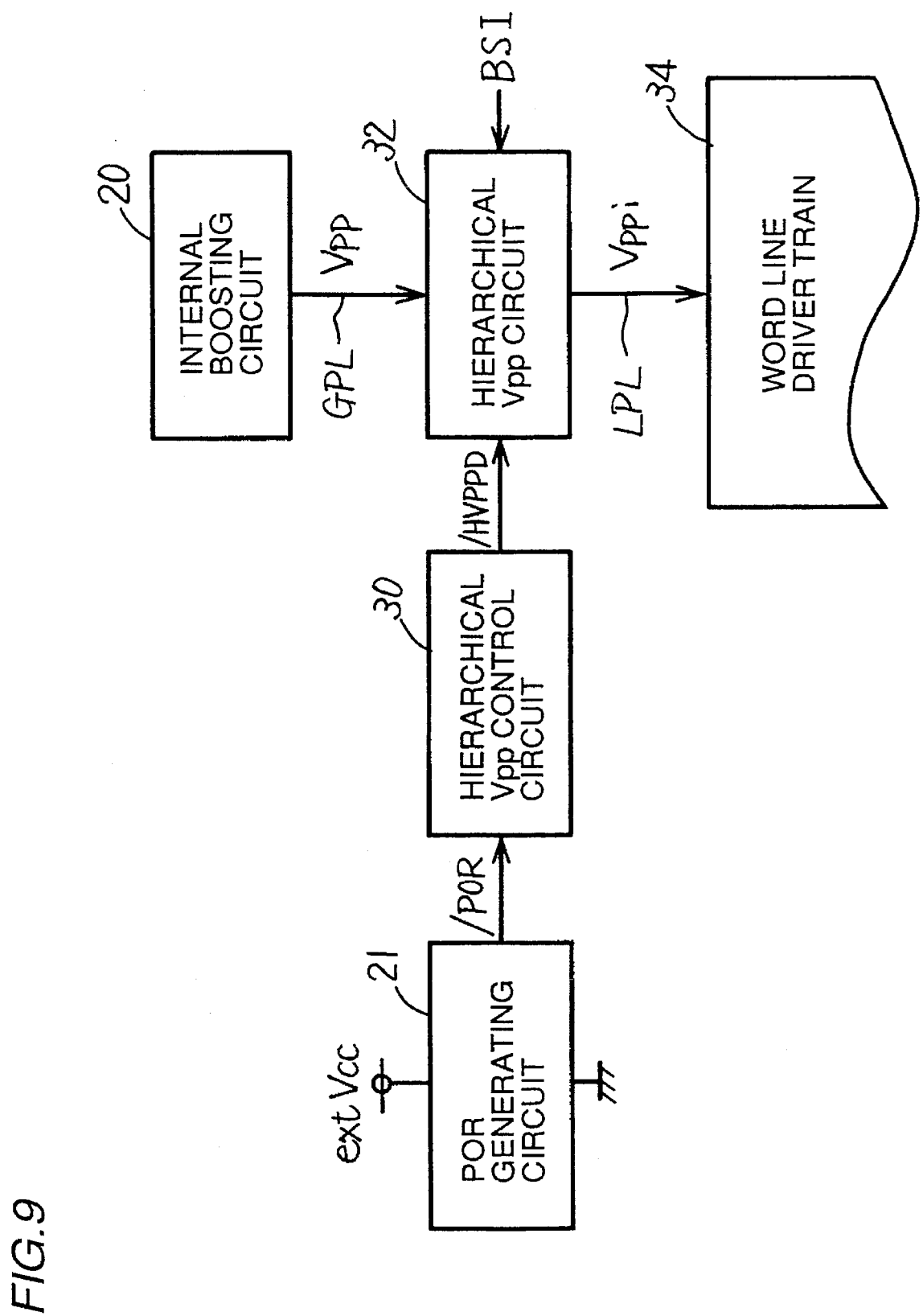
FIG. 9 is a block diagram showing a schematic structure of a DRAM according to Embodiment 4 of the present invention.

Referring to FIG. 9, this semiconductor memory device includes internal boosting circuit 20 supplying boosted power supply potential Vpp to global boosted power-line GPL, POR generating circuit 21 generating power on reset signal /POR based on external power supply potential extVcc, a hierarchical Vpp control circuit 30 generating a hierarchical control signal /HVPPD in response to power on reset signal /POR, a hierarchical Vpp circuit 32 supplying boosted power supply potential Vpp of global boosted power-line GPL to local boosted power-line LPL as boosted power supply potential Vppi in response to hierarchical control signal /HVPPD and block select signal BSI, and a word line driver train 34 including a plurality of word line drivers. Although only one block including hierarchical Vpp circuit 32 and word line driver train 34 is shown in FIG. 9, this semiconductor memory device includes a plurality of such blocks. Block select signal BSI attains the H level when its corresponding block is selected.

Figure 10:
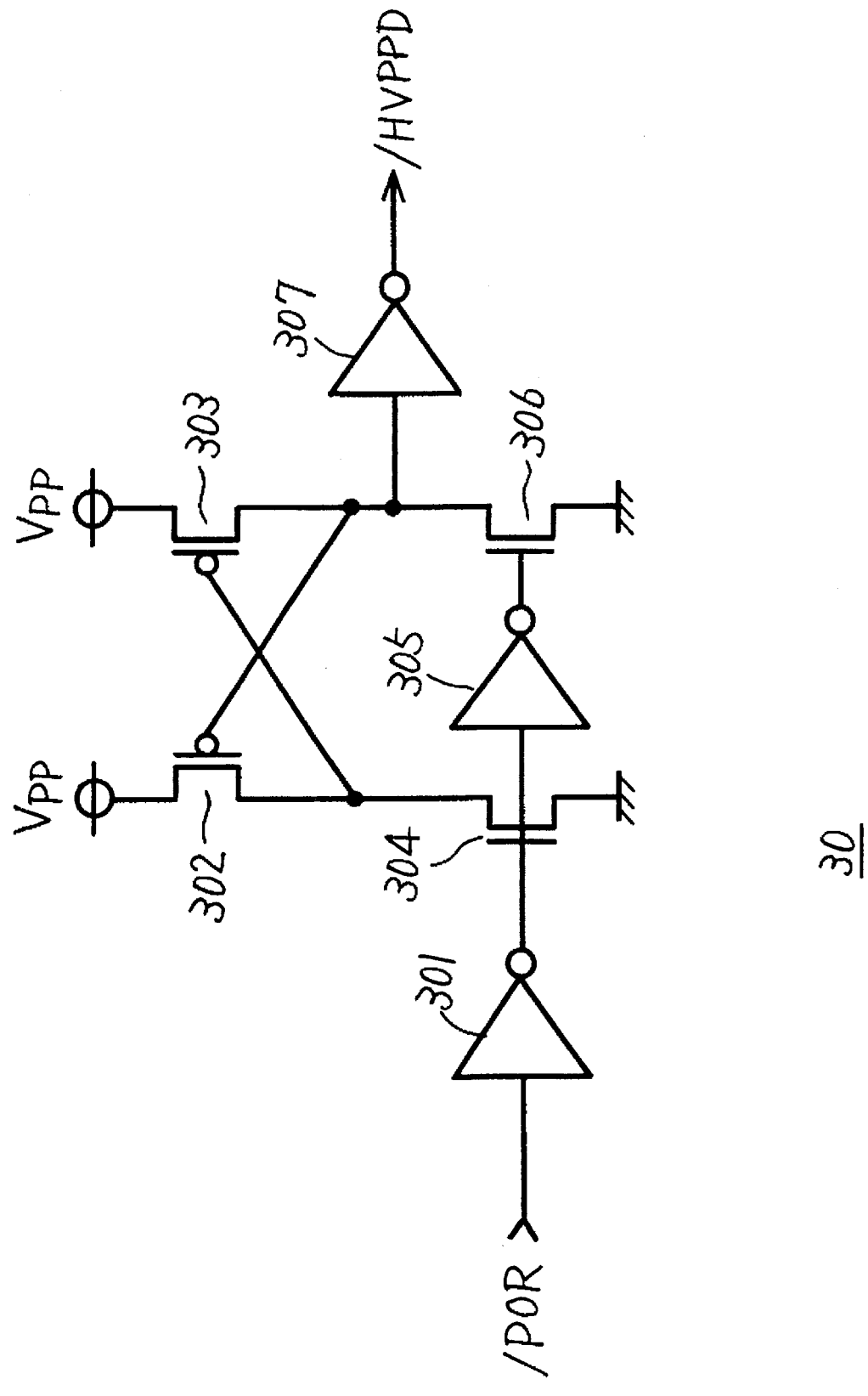
FIG. 10 is a circuit diagram showing a specific structure of a hierarchical Vpp control circuit in FIG. 9.

Referring to FIG. 10, hierarchical Vpp control circuit 30 includes inverters 301, 305 and 307, P channel MOS transistors 302 and 303, and N channel MOS transistors 304 and 306. In hierarchical Vpp control circuit 30, hierarchical control signal /HVPPD at the L level is generated in response to application of power on reset signal /POR at the L level. On the other hand, hierarchical control signal /HVPPD at the H level is generated in response to application of power on reset signal /POR at the H level.

Figure 11:
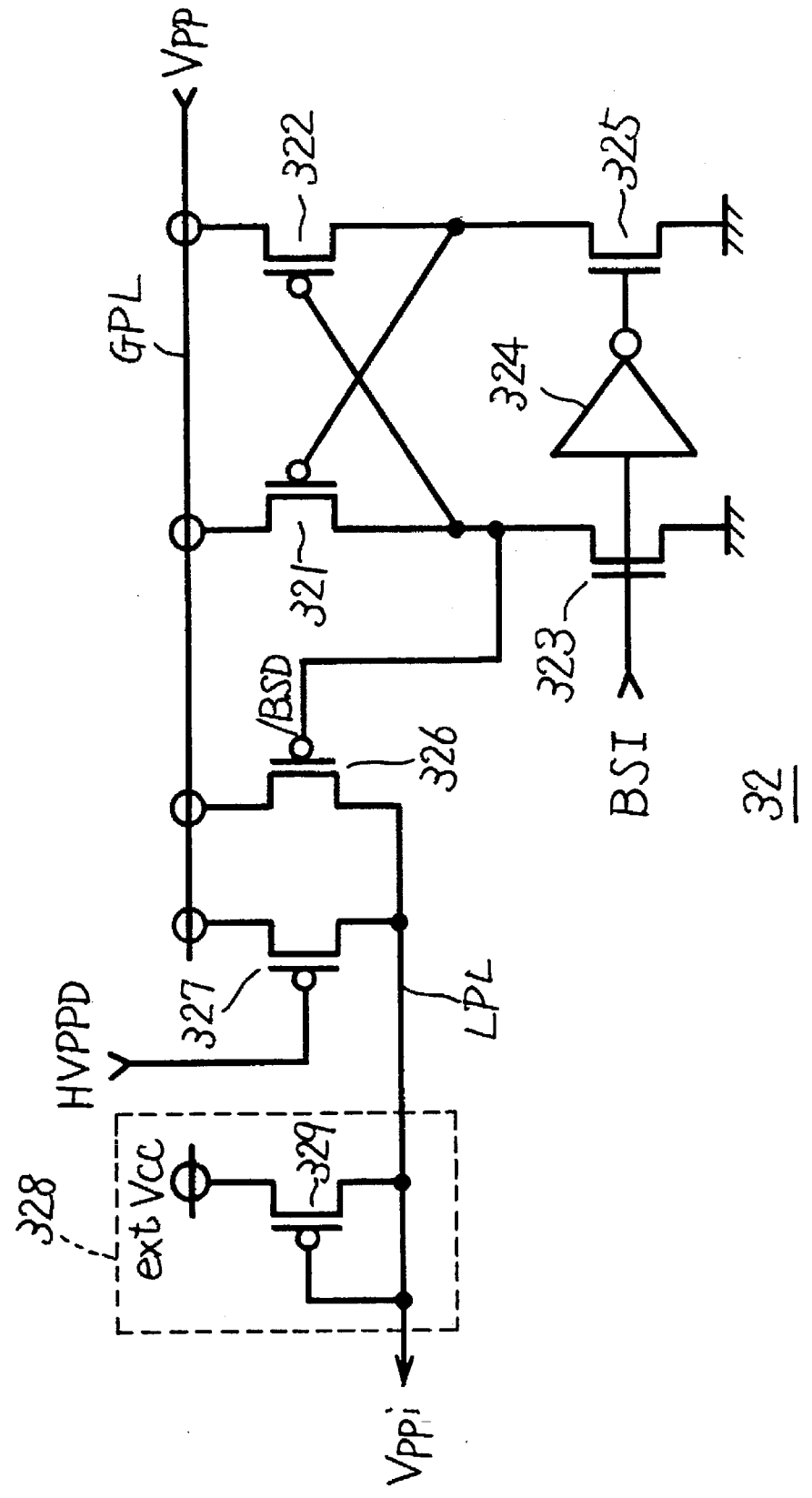
FIG. 11 is a circuit diagram showing a specific structure of a hierarchical Vpp circuit in FIG. 9.

Referring to FIG. 11, hierarchical Vpp circuit 32 includes P channel MOS transistors 321, 322 and 326, N channel MOS transistors 323 and 325, and an inverter 324.

The source electrodes of P channel MOS transistors 321, 322 and 326 are connected together with global boosted power-line GPL. Therefore, when a corresponding block is selected, block select signal BSI at the H level is applied, whereby block select signal /BSD at the L level is applied to the gate electrode of P channel MOS transistor 326.

Hierarchical Vpp circuit 32 further includes a precharge transistor 327 formed of a P channel MOS transistor turned on/off in response to hierarchical control signal /HVPPD from hierarchical Vpp control circuit 30, and a clamping circuit 328 supplying, when boosted power supply potential Vppi of local boosted power-line LPL is lower than a predetermined clamp potential, the clamp potential to local boosted power-line LPL.

Since precharge transistor 327 is turned on in response to application of hierarchical control signal /HVPPD at the L level, boosted power supply potential Vpp of global boosted power-line GPL is supplied to local boosted power-line LPL as boosted power supply potential Vppi during the power on reset period. Therefore, P channel MOS transistor (select transistor) 326 and precharge transistor 327 correspond to one of select transistors BST1 to BSTm in FIG. 2.

Clamping circuit 328 includes a diode-connected P channel MOS transistor 329. P channel MOS transistor 329 is supplied with external power supply potential extVcc at its source electrode. Therefore, clamping circuit 328 employs external power supply potential extVcc as the clamp potential, and always clamps the potential of local boosted power-line LPL to external power supply potential extVcc.

Figure 12:
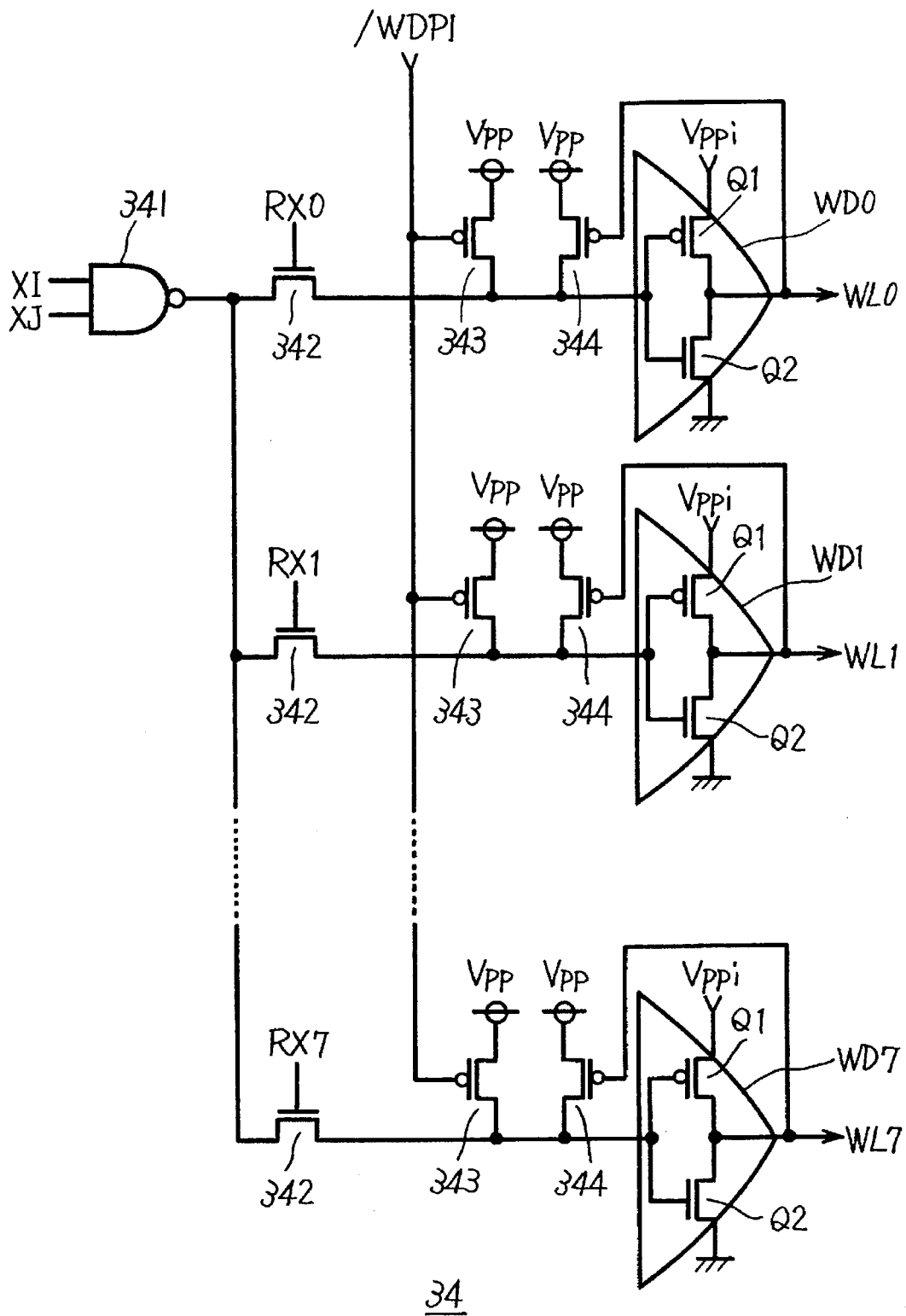
FIG. 12 is a circuit diagram showing a specific structure of a word line driver train in FIG. 9.

Referring to FIG. 12, word line driver train 34 includes word line drivers WD0 to WD7 driving word lines WL0 to WL7, eight P channel MOS transistors 343, eight P channel MOS transistors 344, eight N channel MOS transistors 342, and an NAND gate 341. P channel MOS transistors 343 are supplied with a word line precharge signal /WDPI at their gate electrodes in common. In response to application of block select signal BSI at the L level, word line precharge signal /WDPI attains the L level. On the other hand, in response to application of block select signal BSI at the H level, word line precharge signal /WDPI attains the H level. N channel MOS transistors 342 are supplied with RX decode signals RX0 to RX7 at their gate electrodes, respectively. Predecode signals XI and XJ are applied to NAND gate 341. These signals RX0 to RX7, XI and XJ are generated in response to a row address signal.

Operation of the semiconductor memory device according to Embodiment 4 will be described with reference to FIG. 13.

Figure 13:
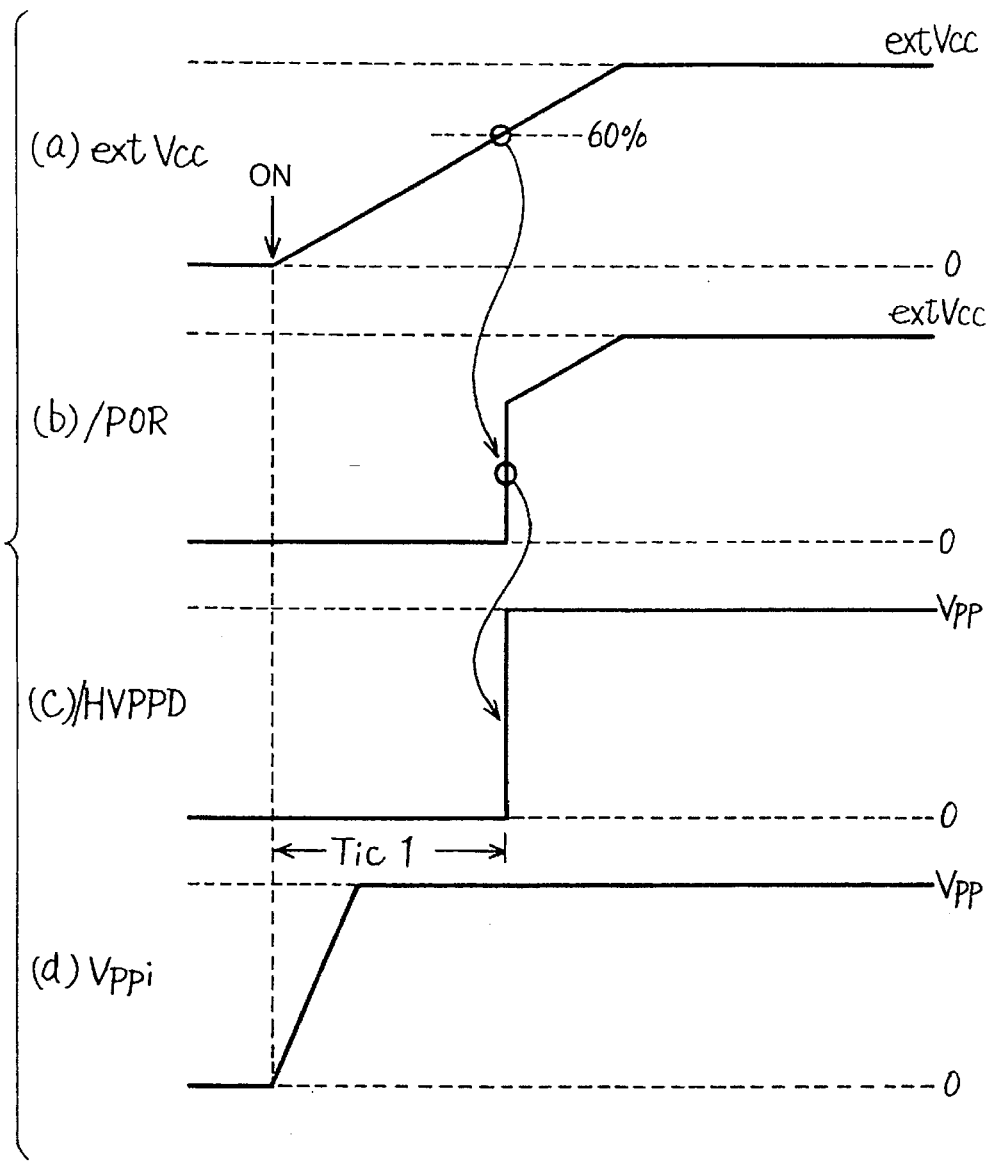
FIG. 13 is a timing chart showing operation of the DRAM shown in FIGS. 9 to 12.

As shown at (a) of FIG. 13, external power supply potential extVcc gradually rises from 0 volt after power on (ON). In response to power on, power on reset signal /POR at the L level is generated as shown at (b) of FIG. 13, and hierarchical control signal /HVPPD at the L level is further generated. Hierarchical control signal /HVPPD at the L level is applied to the gate electrode of precharge transistor 327 in hierarchical Vpp circuit 32, causing precharge transistor 327 to be turned on. Therefore, potential Vppi of local boested power-line LPL gradually rises from 0 volt as shown at (a) of FIG. 13. Since the rising speed of boosted power supply potential Vpp is lower than that of external power supply potential extVcc, P channel MOS transistor 329 of clamping circuit 328 increases potential Vppi of local boosted power-line LPL toward external power supply potential extVcc immediately after power on.

When external power supply potential extVcc attains 60% of a predetermined level as shown at (a) of FIG. 13, power on reset signal /POR attains the H level as shown at (b) of FIG. 13, and further, hierarchical control signal /HVPPD attains the H level as shown at (c) of FIG. 13. Since hierarchical control signal /HVPPD at the H level is applied to the gate electrode of precharge transistor 327 of hierarchical Vpp circuit 32, initial charge of local boosted power-line LPL by precharge transistor 327 is completed. Therefore, local boosted power-line LPL is charged up to boosted power supply potential Vpp while power on reset signal /POR is at the L level, that is, during the power on reset period (initial charge period Tic1).

When a certain one block is selected, block select signal BSI attains the H level. Block select signal BSI at the H level is applied to hierarchical Vpp circuit 32, whereby select transistor 326 is turned on in response to a block select signal /BSD at the L level. Since local boosted power-line LPL is already charged up to boosted power supply potential Vpp, word line drivers WD0 to WD7 may be activated immediately in response to a row address signal.

On the other hand, when this one block is not selected, block select signal BSI attains the L level, whereby select transistor 326 is turned off in response to block select signal /BSD at the H level.

If such a non-selected state (stand-by state) lasts long, the potential of local boosted power-line LPL falls from boosted power supply potential Vpp. The potential of local boosted power-line LPL would fall down to 0 volt without clamping circuit 328. However, since clamping circuit 328 is provided in Embodiment 4, potential Vppi of local boosted power-line LPL will not fall down to 0 volt, even if the stand-by state lasts long. Since clamping circuit 328 is formed of diode-connected transistor 329, potential Vppi of local boosted power-line LPL will not be lower than extVcc-Vth (Vth: threshold voltage of transistor 329).

As described above, since clamping circuit 328 is provided in Embodiment 4, potential Vppi of local boosted power-line LPL does not decrease substantially from boosted power supply potential Vpp even if the stand-by state lasts long. As a result, word line drivers WD0 to WD7 may be activated immediately after selection of the block. Such an effect is brought about by Embodiment 4, in addition to the effect of the above described Embodiment 1.

Although external power supply potential extVcc is used as the clamp potential in clamping circuit 328 in Embodiment 4, the potential other than boosted power supply potential Vpp, for example, internal power supply potential intVcc, may be used. More specifically, any potential can be used as the clamp potential as far as it rises earlier than boosted power supply potential Vpp.

Embodiment 5

Figure 14:
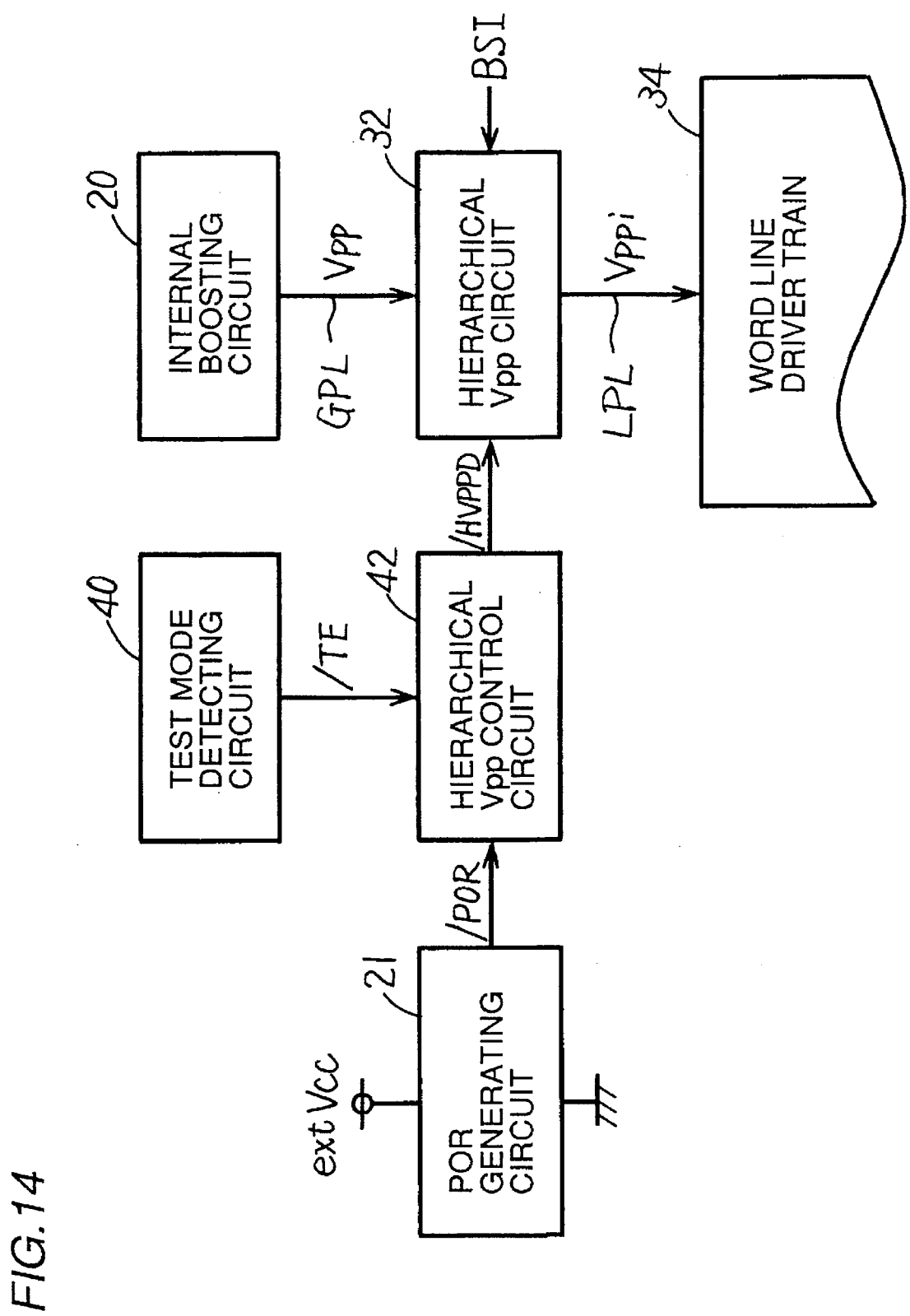
FIG. 14 is a block diagram showing a schematic structure of a DRAM according to Embodiment 5 of the present invention.

Referring to FIG. 14, this semiconductor memory device further includes a test mode detecting circuit 40, in addition to the components of FIG. 9. Test mode detecting circuit 40 generates a test enable signal /TE at the L level upon detection of a test mode. A hierarchical Vpp control circuit 42 in Embodiment 5 generates hierarchical control signal /HVPPD in response not only to power on reset signal /POR but also to test enable signal /TE.

Figure 15:
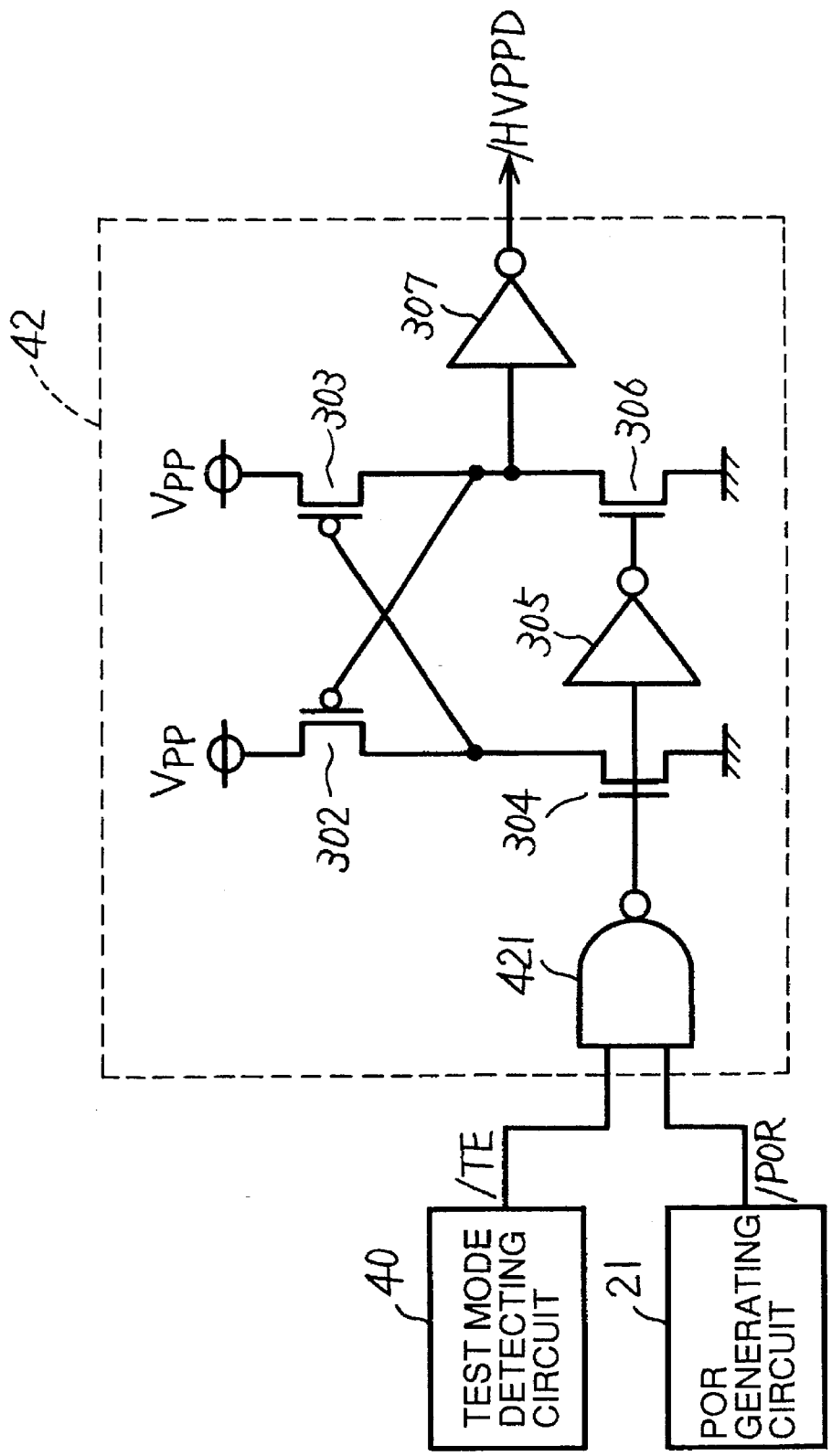
FIG. 15 is a circuit diagram showing a specific structure of a hierarchical Vpp control circuit 42 in FIG. 14.

Referring to FIG. 15, hierarchical Vpp control circuit 42 includes an NAND gate 421 instead of inverter 301 in hierarchical Vpp control circuit 30 shown in FIG. 10. Power on reset signal /POR from POR generating circuit 21 and test enable signal /TE from test mode detecting circuit 40 are applied to NAND gate 421. Therefore, when at least one of power on reset signal /POR and test enable signal /TE attains the L level, hierarchical control signal /HVPPD at the L level is generated.

Operation of the semiconductor memory device according to Embodiment 5 will now be described.

In the normal mode excluding the test mode, this semiconductor memory device operates similarly to that of the above described Embodiment 4.

In the test mode, test mode detecting circuit 40 generates test enable signal /TE at the L level in response to address key input, for example. The test mode includes the case where an acceleration test of a gate oxide film is carried out efficiently in a short time by simultaneously activating a plurality of word lines, for example. When test enable signal /TE at the L level is generated, hierarchical control signal /HVPPD at the L level is applied to the gate electrode of precharge transistor 327 (FIG. 11) in hierarchical Vpp circuit 32. This causes local boosted power-lines LPL in all the blocks to be connected to global boosted power-line GPL. Therefore, such an acceleration test as described above can be conducted. In other words, test mode detecting circuit 40 switches from the hierarchical power-line scheme to the normal scheme upon detection of the test mode.

Note that a power on reset signal /POR 8 in FIG. 19 to be described later or boost enable signal BTE from Vpp level detector 216 in FIG. 7 described above may be used instead of power on reset signal /POR.

As described above, according to Embodiment 5, local boosted power-lines LPL in all the blocks are connected to global boosted power-line GPL in response not only to power on reset signal /POR but also to test enable signal /TE activated in the test mode. Therefore, such an acceleration test as activating a plurality of word lines simultaneously can be conducted.

Embodiment 6

Figure 16:
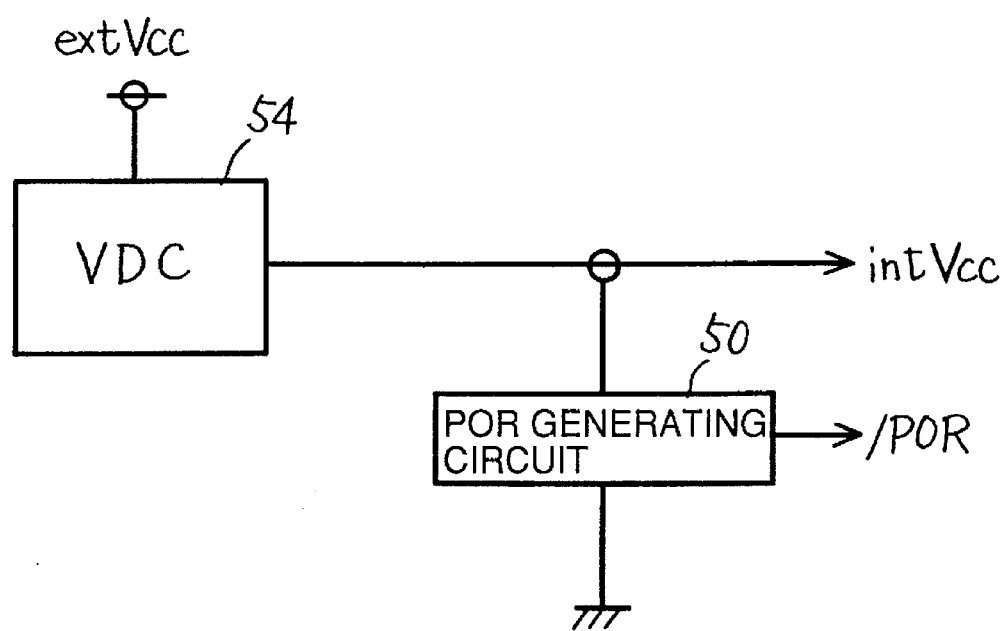
FIG. 16 is a block diagram showing a main structure of a DRAM according to Embodiment 6 of the present invention.

Referring to FIG. 16, this semiconductor memory device includes a voltage down converter (VDC) 54 generating, based on external power supply potential extVcc, internal power supply potential intVcc lower than the external power supply potential, and a POR generating circuit 50 generating power on reset signal /POR based on the generated internal power supply potential intVcc. Unlike POR generating circuit 21 in FIG. 9, POR generating circuit 50 receives internal power supply potential intVcc.

Figure 17:
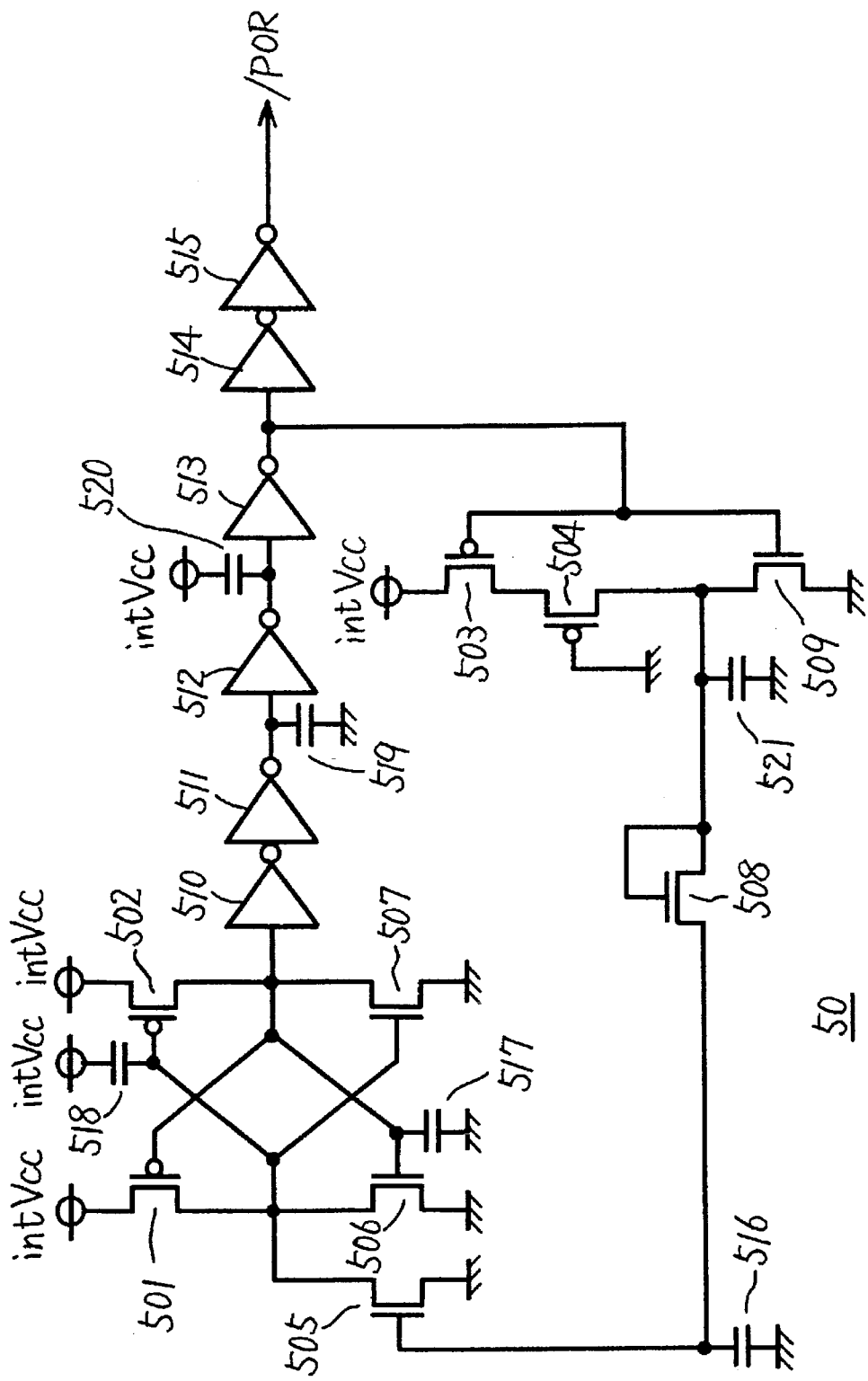
FIG. 17 is a circuit diagram showing a specific structure of a POR generating circuit in FIG. 16.

Referring to FIG. 17, POR generating circuit 50 includes P channel MOS transistors 501 to 504, N channel MOS transistors 505 to 509, inverters 510 to 515, and capacitors 516 to 521. P channel MOS transistors 501 to 503 are supplied with internal power supply potential intVcc at their source electrodes. Internal power supply potential intVcc is also applied to the respective one electrodes of capacitors 518 and 520.

Operation of the semiconductor memory device according to Embodiment 6 will now be described with reference to FIG. 18.

Figure 18:
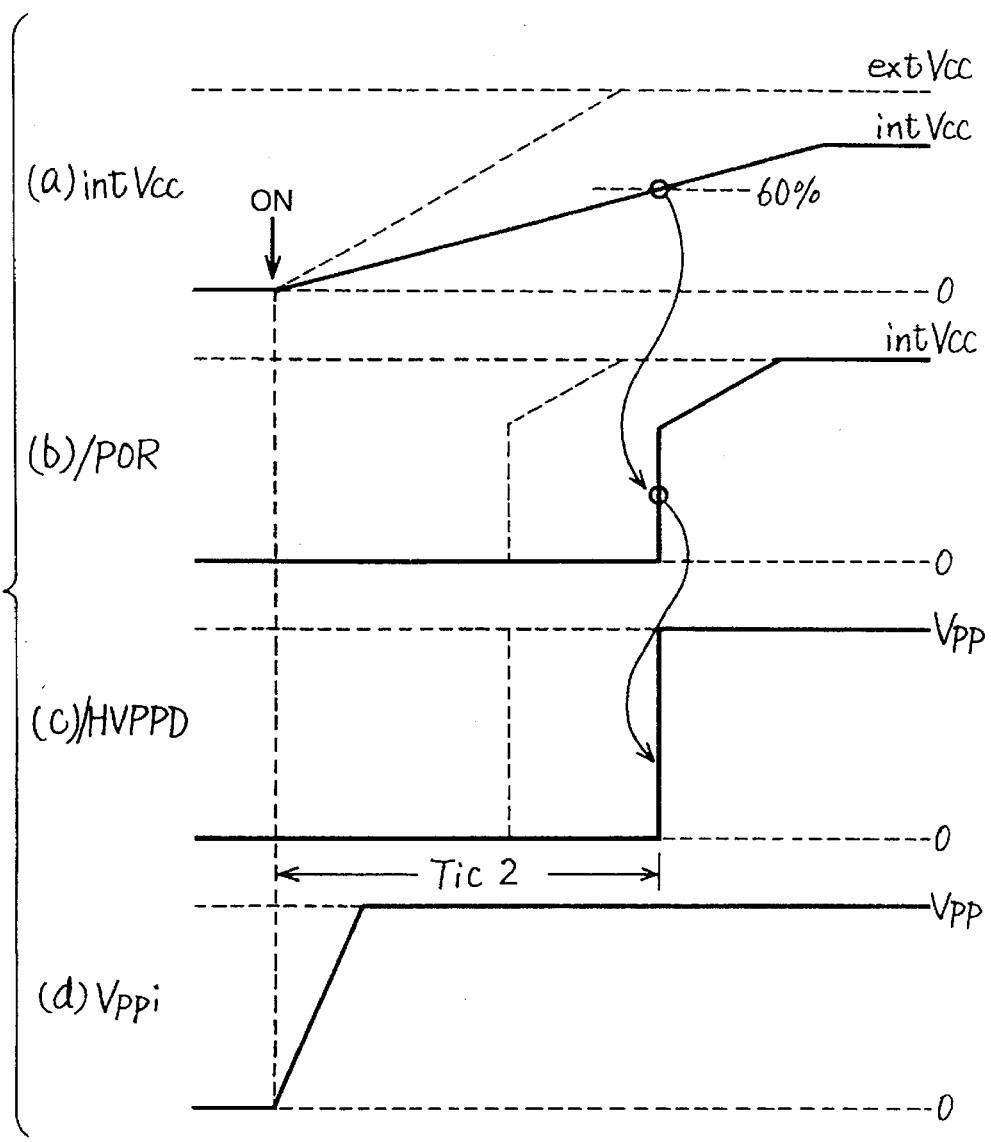
FIG. 18 is a timing chart showing operation of the DRAM shown in FIGS. 16 and 17.

As shown at (a) of FIG. 18, external power supply potential extVcc rises from 0 volt to a predetermined level in response to power on. Internal power supply potential intVcc rises from 0 volt to a predetermined level slower than external power supply potential extVcc. Since such internal power supply potential intVcc is supplied to POR generating circuit 50, POR generating circuit 50 deactivates power on reset signal /POR at the L level to the H level as shown at (b) of FIG. 18, when internal power supply potential intVcc attains 60% of the predetermined level. Therefore, the L level of power on reset signal /POR lasts longer in this case than in the case where external power supply potential extVcc is supplied to the POR generating circuit. Therefore, the L level of hierarchical control signal /HVPPD lasts longer similarly as shown at (c) of FIG. 18. As a result, an initial charge period Tic2 of local boosted power-line LPL becomes longer than initial charge period Tic1 in FIG. 13.

In FIG. 18, it is assumed that boosted power supply potential Vpp sufficiently attains the predetermined level before rising of external power supply potential extVcc. However, there may be a case where boosted power supply potential Vpp does not attain the predetermined level sufficiently before rising of external power supply potential extVcc. According to Embodiment 6, since the local boosted power-line is connected to global boosted power-line GPL over longer initial charge period Tic2, local boosted power-line LPL can be charged to boosted power supply potential Vpp sufficiently even in such a case.

Figure 6:
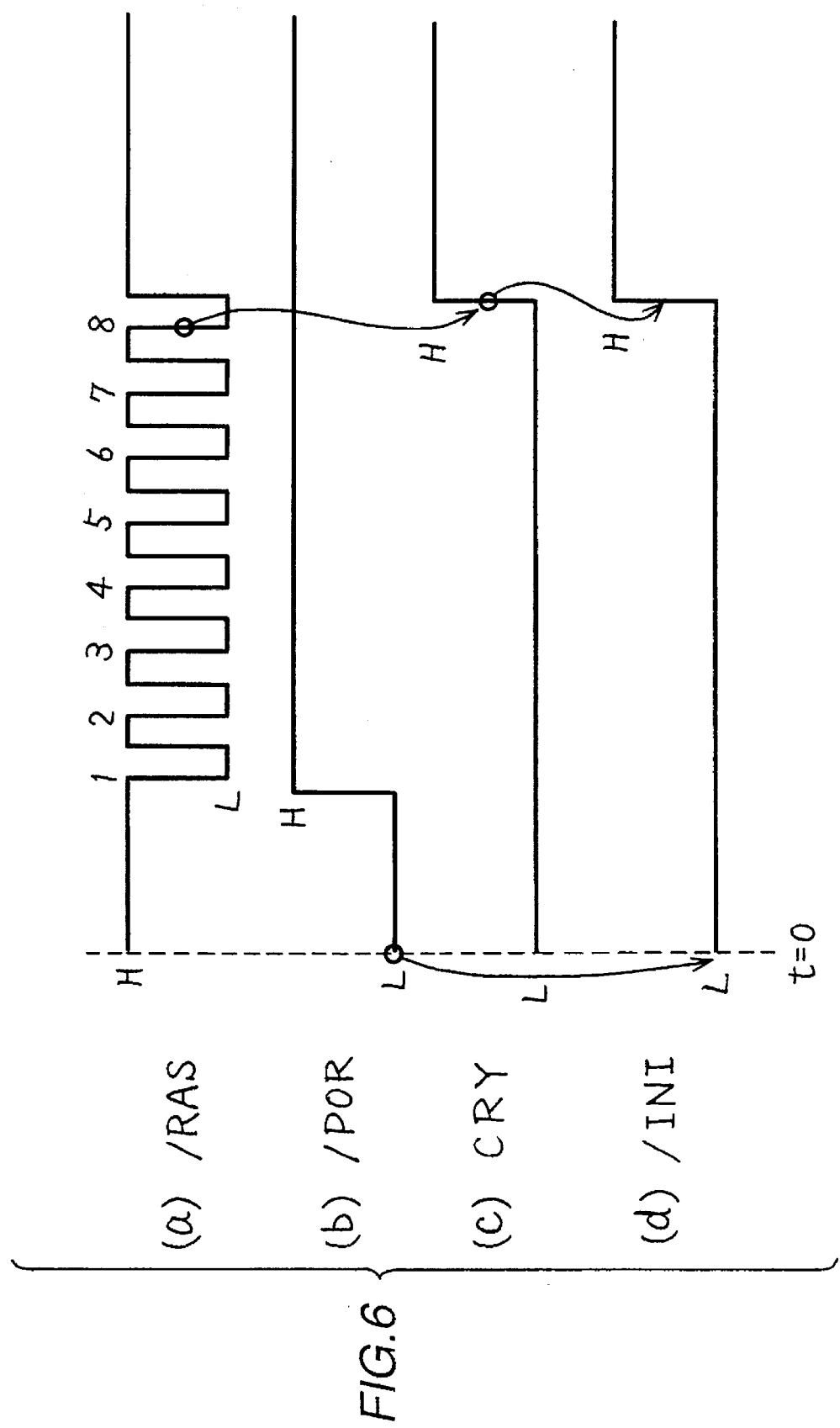
FIG. 6 is a timing chart showing operation of a delay circuit in the DRAM shown in FIG. 5.

Although row address strobe signal /RAS is toggled eight times after deactivation of power on reset signal /POR in FIG. 6, power on reset signal /POR may sometimes be deactivated after row address strobe signal /RAS is toggled eight times, when external power supply potential extVcc slowly rises. Embodiment 6 is particularly effective in such a case.

Embodiment 7

Figure 19:
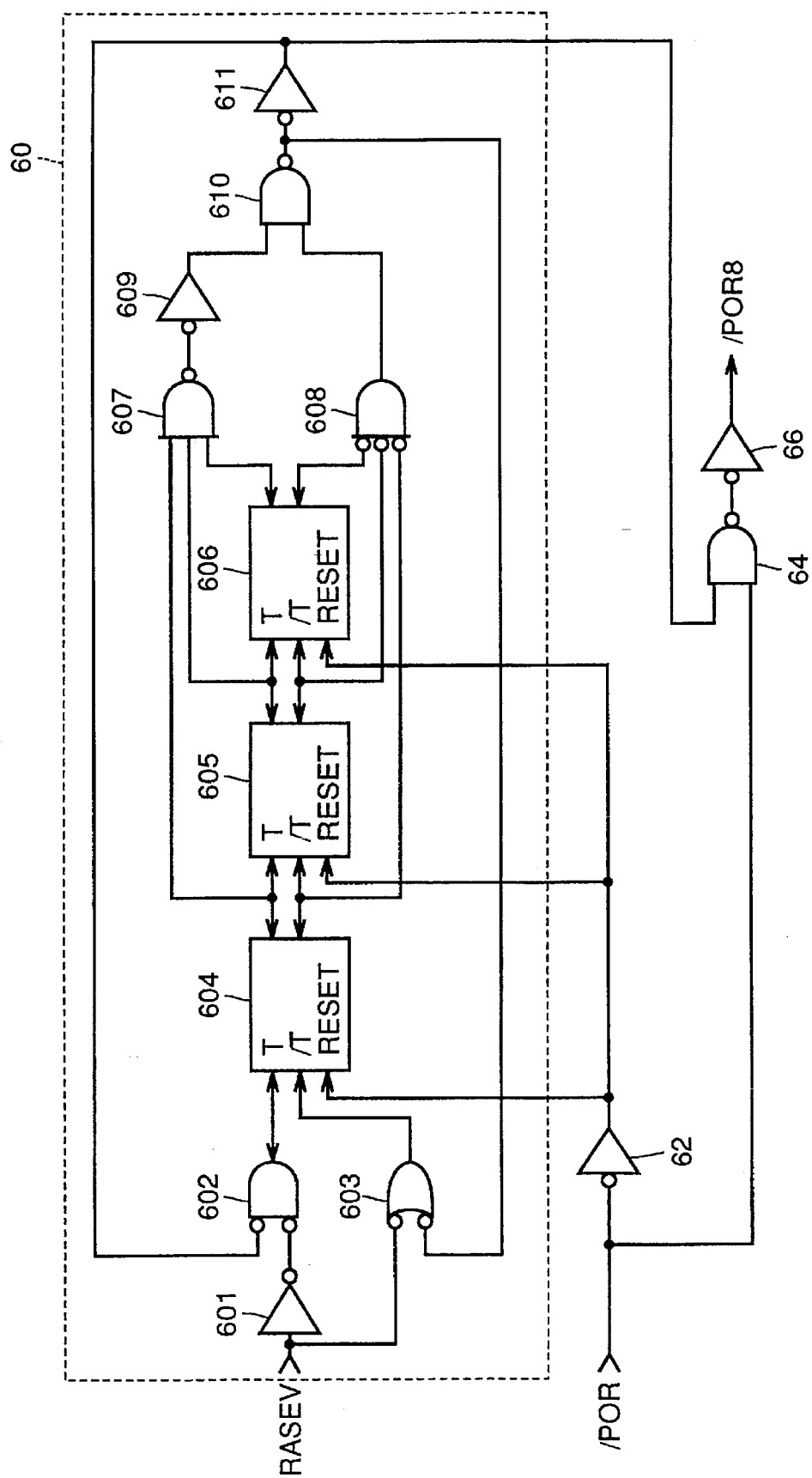
FIG. 19 is a block diagram showing a structure of a counter according to Embodiment 7 of the present invention, which counts an 8-cycle row address strobe signal for resetting internal circuitry of a DRAM.

FIG. 19 shows a specific structure of a counter 60 according to Embodiment 7, which corresponds to counter 241 in FIG. 5. Referring to FIG. 19, counter 60 includes 2-bit counters 604 to 606, inverters 601, 609 and 611, and logic gates 602, 603, 607, 608 and 610. A control signal RASEV obtained by inverting row address strobe signal /RAS is applied to counter 60. Power on reset signal /POR is applied to reset inputs of 2-bit counters 604 to 606 through an inverter 62 in common. Therefore, counter 60 is reset in response to power on reset signal /POR at the L level, counts how many times row address strobe signal /RAS is toggled, and deactivates, when row address strobe signal /RAS is toggled eight times, its output signal to the H level. The output signal of counter 60 and power on reset signal /POR are applied to NAND gate 64, and the output signal of NAND gate 64 is inverted by an inverter 66, whereby power on reset signal /POR 8 is generated.

In Embodiment 7, not the above described power on reset signal /POR but power on reset signal /POR 8 is applied to hierarchical Vpp control circuit 30 or 42. Therefore, when power on reset signal /POR is deactivated to the H level and the output signal of counter 60 is deactivated to the H level, power on reset signal /POR 8 is deactivated to the H level, whereby initial charge of local boosted power-line LPL is completed.

According to this Embodiment 7, even if the power supply potential rises earlier, the local boosted power-line is charged until row address strobe signal /RAS is toggled eight times. Therefore, as compared to the case where only power on reset signal /POR is used, local boosted power-line LPL is initially charged more sufficiently.

Embodiment 8

Figure 20:
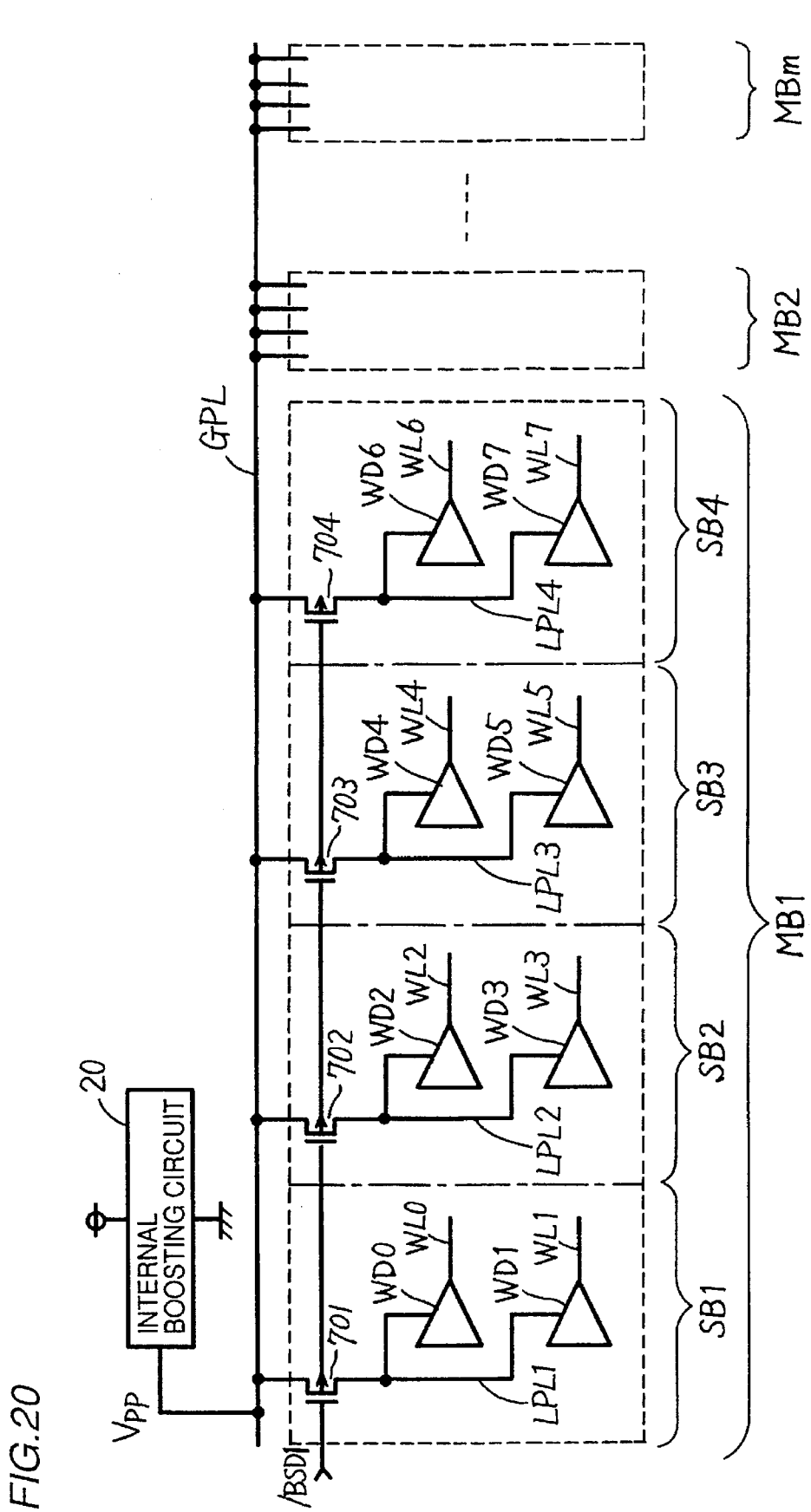
FIG. 20 is a block diagram showing a main structure of a DRAM according to Embodiment 8 of the present invention.

Referring to FIG. 20, this semiconductor memory device includes internal boosting circuit 20, global boosted power-line GPL, and m main blocks MB1 to MBm. Each of main blocks MB1 to MBm is divided into four subblocks SB1 to SB4. For example, main block MB1 includes P channel MOS transistors 701 to 704 turned on/off in response to block select signal /BSD, local boosted power-lines LPL1 to LPL4 connected together to global boosted powersline GPL through transistors 701 to 704, and word line drivers WD0 to WD7 connected to local boosted power-lines LPL1 to LPL4. Each of subblocks SB1 to SB4 includes one P channel MOS transistor, one local boosted power-line, and two word line drivers. For example, subblock SB1 includes P channel MOS transistor 701, local boosted power-line LPL1, and word line drivers WD0 and WD1.

Operation of Embodiment 8 will now be described.

First, any of main blocks MB1 to MBm is selected in response to an address signal. When main block MB1 is selected for example, a block select signal /BSD1 at the L level is applied to the gate electrodes of P channel MOS transistors 701 to 704. In response to this, boosted power supply potential Vpp is supplied to word line drivers WD0 to WD7 through global boosted power-line GPL and P channel MOS transistors 701 to 704. In subblock SB1 for example, boosted power supply potential Vpp of global boosted power-line GPL is supplied to word line drivers WD0 and WD1 through P channel MOS transistor 701. In the other subblocks SB2 to SB4, the similar operation is carried out. In response to a row address signal, one of word line drivers WD0 to WD7 activates a corresponding word line.

In FIG. 2, one select transistor is provided for one block, and boosted power supply potential Vpp is supplied to a number of word line drivers through one select transistor. Therefore, the size of the select transistor must be large. On the other hand, in Embodiment 8, four transistors 701 to 704 are provided for one main block MB1, and boosted power supply potential Vpp is supplied to two word line drivers (WD0 to WD7) through one transistor (701 to 704). Therefore, transistors 701 to 704 may be reduced in size.

Embodiment 9

Figure 21:
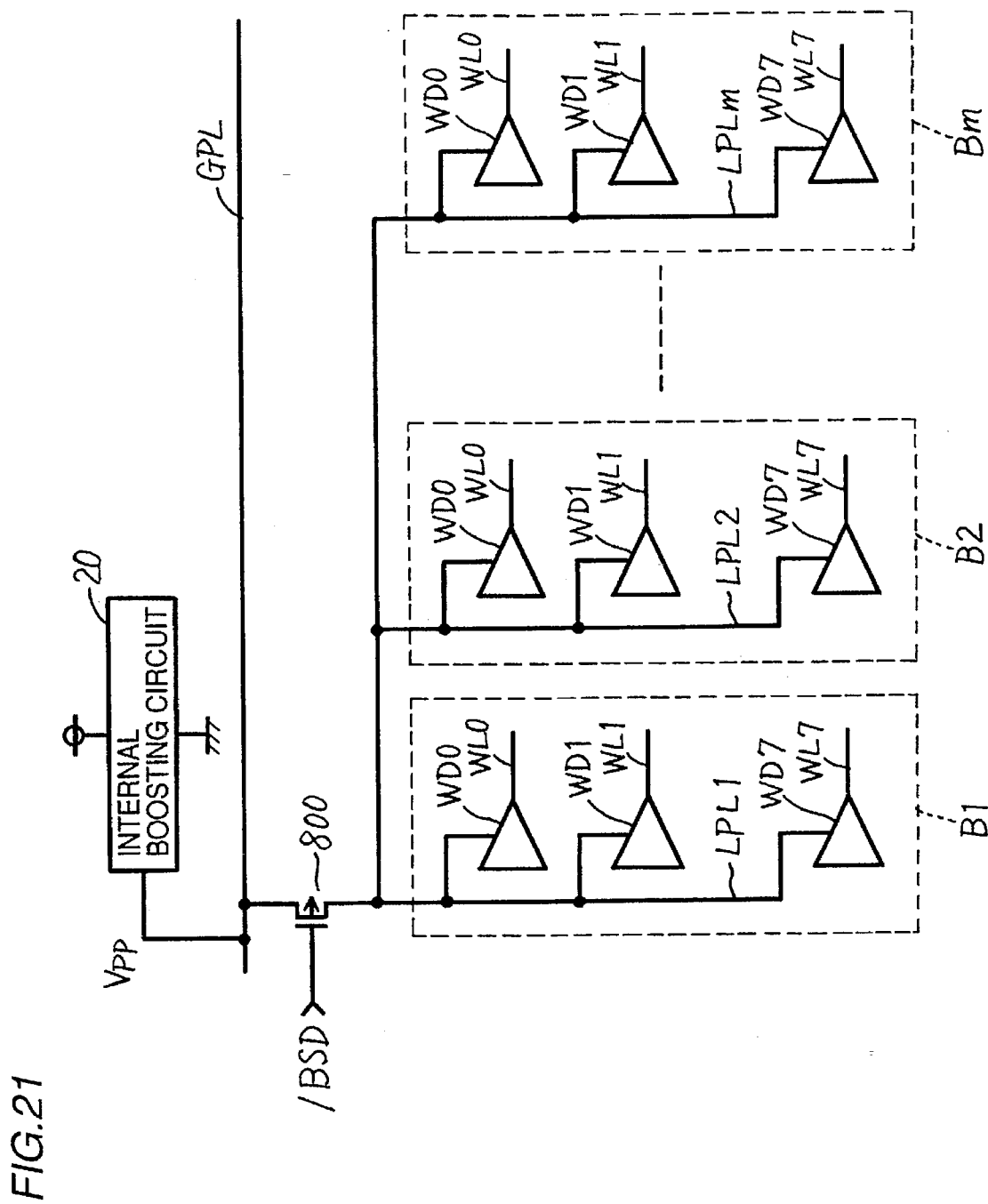
FIG. 21 is a block diagram showing a main structure of a DRAM according to Embodiment 9 of the present invention.

Referring to FIG. 21, this semiconductor memory device includes internal boosting circuit 20, global boosted power-line GPL, a select transistor 800, and m blocks B1 to Bm. Blocks B1 to Bm include local boosted power-lines LPL1 to LPLm, respectively. Each of blocks B1 to Bm further includes eight word line drivers WD0 to WD7. More specifically, these blocks B1 to Bm are not divided into subblocks SB1 to SB4, unlike main blocks MB1 to MBm of FIG. 20. Further, one select transistor is not provided corresponding to each block. In this embodiment, one select transistor 800 is provided corresponding to m blocks B1 to Bm.

Operation of this semiconductor memory device will now be described.

First, any of blocks B1 to Bm is selected in response to an address signal. Irrespective of which block being selected, select transistor 800 is turned on in response to block select signal /BSD at the L level. This causes boosted power supply potential Vpp of global boosted power-line GPL to be supplied to local boosted power-lines LPL1 to LPLm through select transistor 800. Then, in response to a row address signal, one of word line drivers WD0 to WD7 in the selected block activates a corresponding word line.

While one select transistor is required for each block in FIG. 2, one select transistor 800 is provided corresponding to a plurality of blocks B1 to Bm in Embodiment 9. Therefore, the hierarchical boosted power-line scheme is simplified.

Embodiment 10

Figure 22:
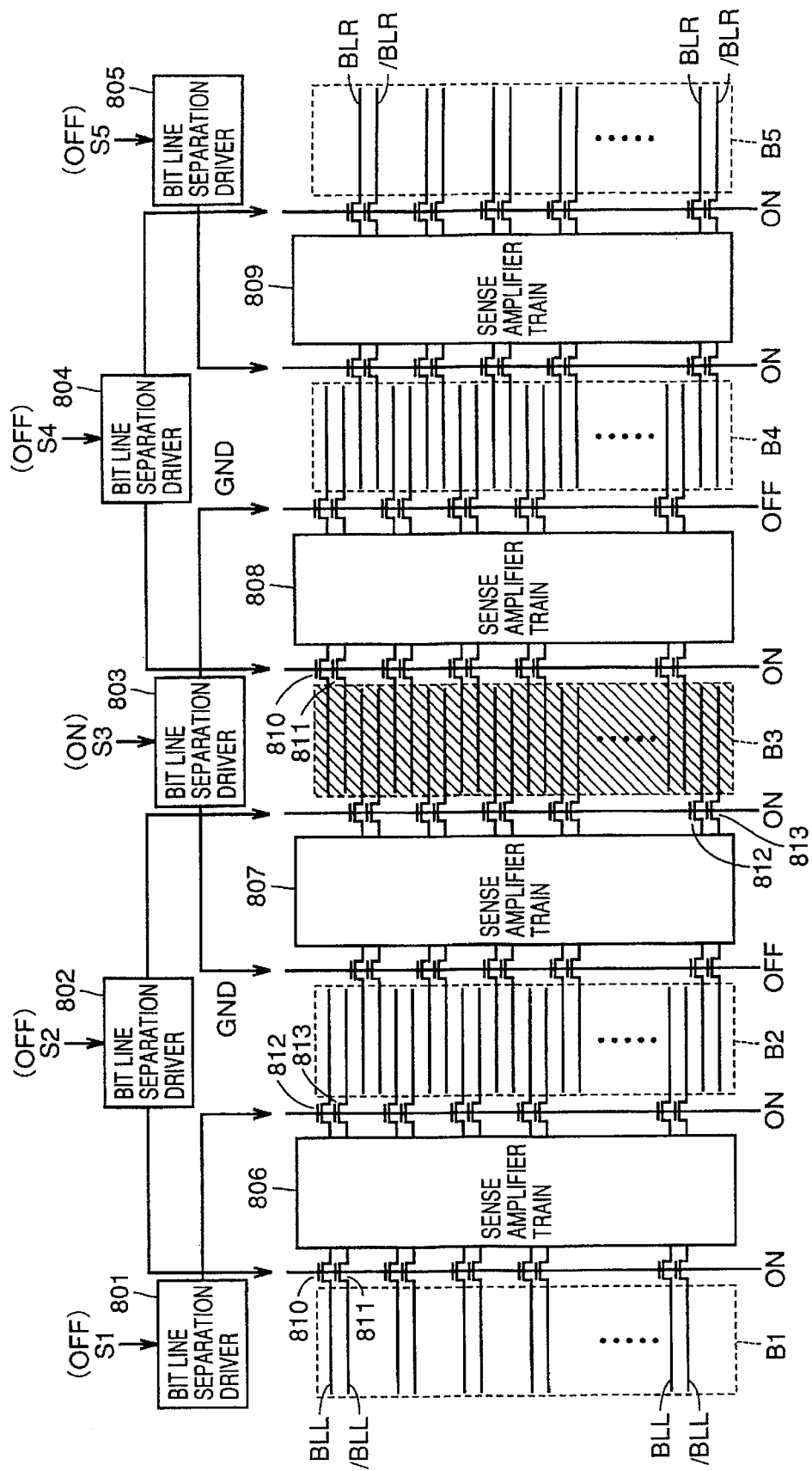
FIG. 22 is a block diagram showing a main structure of a conventional DRAM employing a shared sense amplifier scheme.
Figure 23:
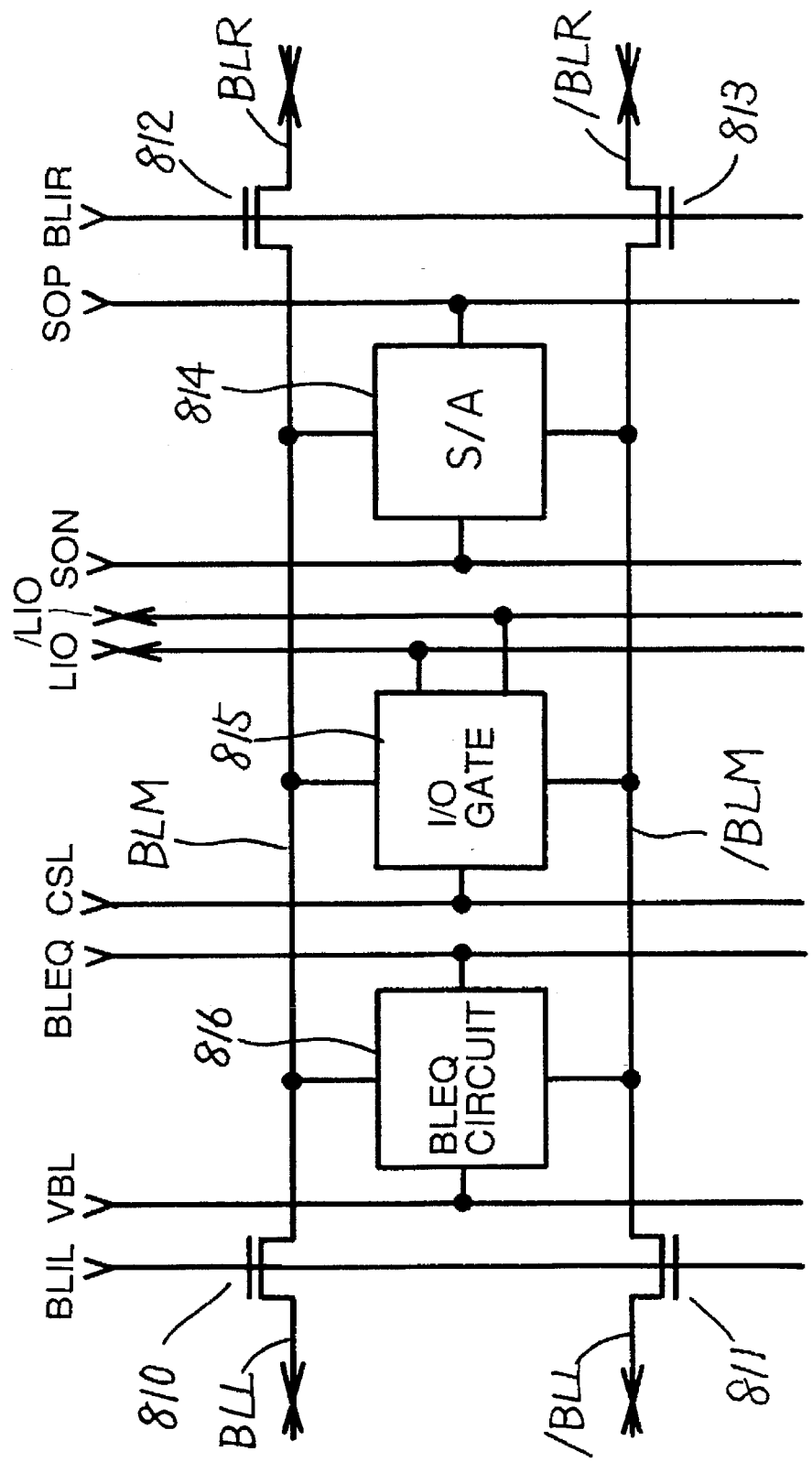
FIG. 23 is a block diagram showing a specific structure of one train in FIG. 22.

As shown in FIGS. 22 and 23, bit line pair BLL, /BLL on the left side and bit line pair BLR, /BLR on the right side share one sense amplifier (S/A) 814. When none of blocks B1 to B5 is selected, all bit line separation drivers 801 to 805 apply bit line separation signals BLIL and BLIR at the boosted power supply potential Vpp level to the gate electrodes of all separation transistors 810 to 813. Therefore, all separation transistors 810 to 813 are turned on. Bit line separation signals BLIL and BLIR at the boosted power supply potential Vpp level are applied so that data at the power supply potential Vcc level is applied to bit line pairs BLL, /BLL and BLR, /BLR without the level being decreased by the threshold voltage of separation transistors 810 to 813.

When block B3 is selected for example, bit line separation driver 803 applies bit line separation signal BLIL not at the Vpp level but at the ground GND level to the gate electrodes of corresponding separation transistors 810 and 811, and applies bit line separation signal BLIR at the GND level to the gate electrodes of corresponding separation transistors 812 and 813. As a result, bit lines BLL and /BLL in block B2 are separated from sense amplifier 814 in a sense amplifier train 807, and only bit lines BLR and /BLR in block B2 are connected to sense amplifier 814 in sense amplifier train 807. Further, bit lines BLR and /BLR in block B4 are separated from sense amplifier 814 in a sense amplifier train 808, and only bit lines BLL and /BLL in block B3 are connected to sense amplifier 814 in sense amplifier train 808.

As described above, in the conventional semiconductor memory device, an internal boosting circuit (not shown) generating boosted power supply potential Vpp must have a large load, since bit line separation signals BLIL and BLIR at the Vpp level are applied to the gate electrodes of a plurality of separation transistors 810 to 813. Therefore, one object of Embodiment 10 to be described hereinafter is to provide a semiconductor memory device having an internal boosting circuit with a small load.

Figure 24:
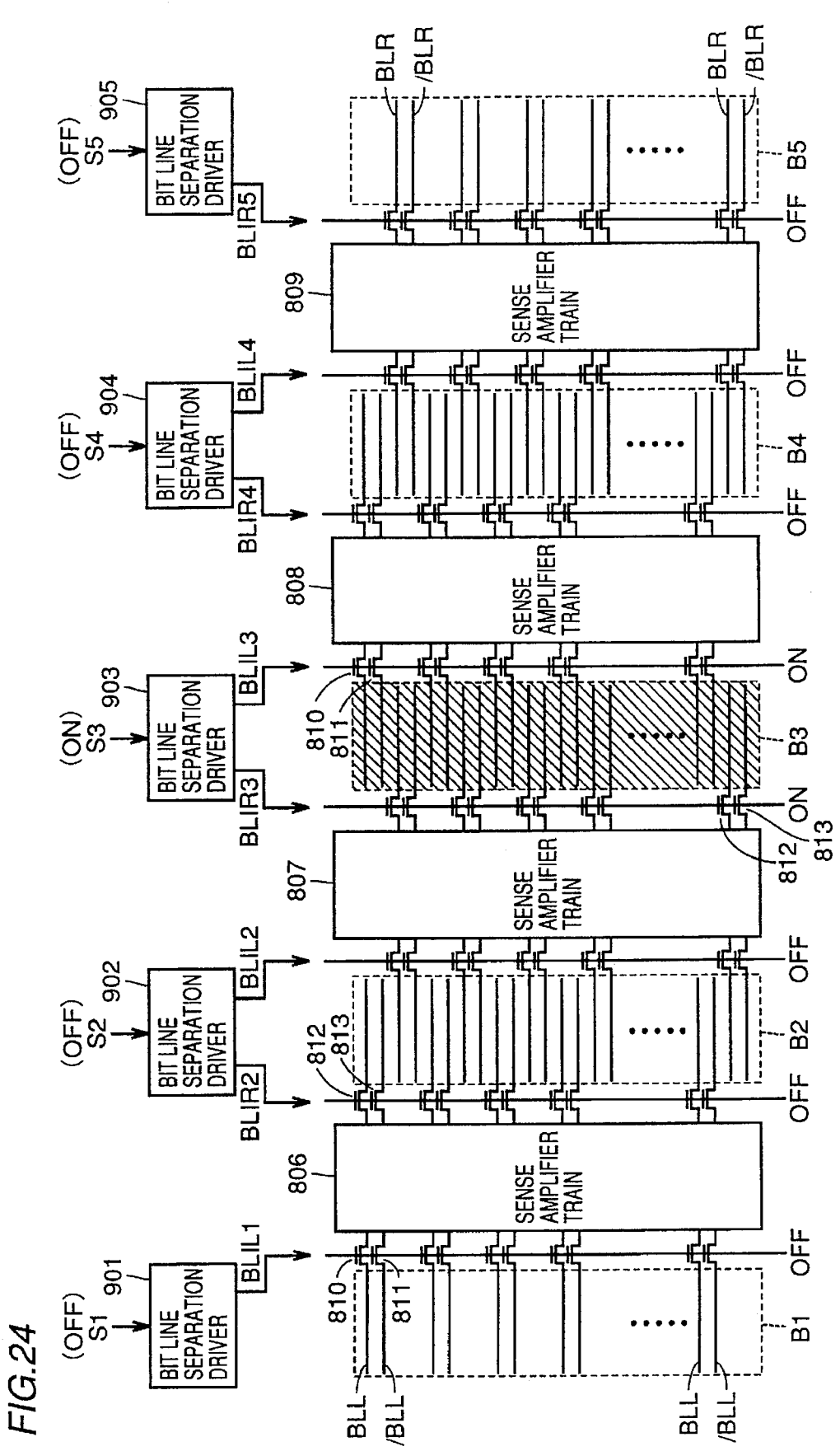
FIG. 24 is a block diagram showing a main structure of a DRAM according to Embodiment 10 of the present invention.

Referring to FIG. 24, this semiconductor memory device includes a plurality of blocks B1 to B5, a plurality of sense amplifier trains 806 to 809 each provided between two of blocks B1 to B5, a plurality of separation transistors 810 to 813 provided on both sides of sense amplifier trains 806 to 809, and bit line separation drivers 901 to 905 driving separation transistors 810 to 813. Each of blocks B1 to B5 includes a plurality of bit line pairs BLL, /BLL and BLR, /BLR provided in column, a plurality of word lines (not shown) provided in row, and a plurality of memory cells (not shown) provided at crossing points between the bit line pairs and the word lines.

Figure 25:
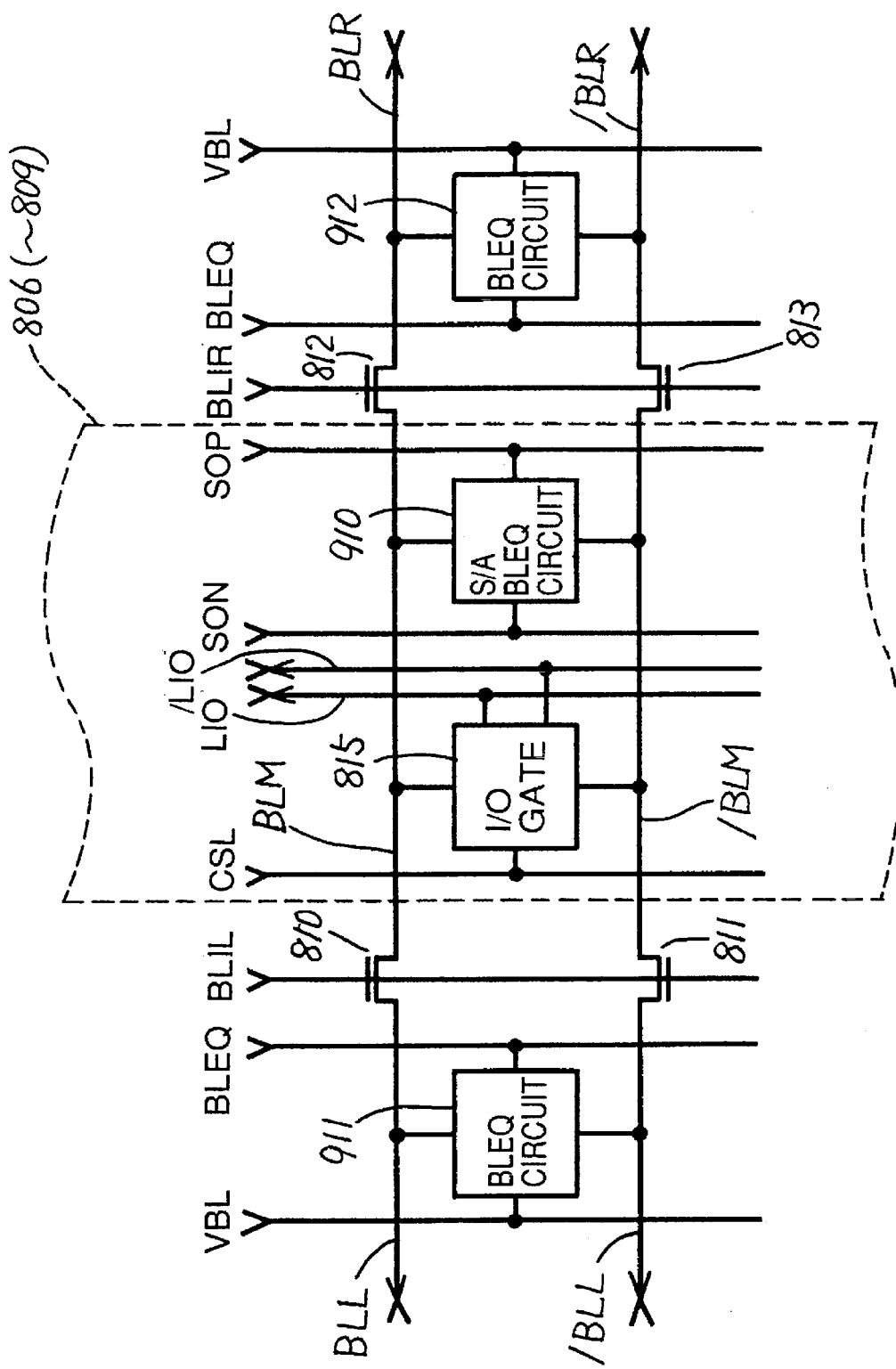
FIG. 25 is a block diagram showing a specific structure of one train in FIG. 24.

Referring to FIG. 25, each of sense amplifier trains 806 to 809 includes a plurality of sense amplifiers and bit line equalize circuits, and a plurality of input/output (I/O) gates 815. In FIG. 25, one sense amplifier and bit line equalize circuit 910 and one input/output gate 815 are shown. Each sense amplifier and bit line equalize circuit 910 corresponds to one bit line pair BLL, /BLL in the left block as well as one bit line pair BLR, /BLR in the right block. Bit line pair BLL, /BLL is connected to sense amplifier and bit line equalize circuit 910 through separation transistor pair 810, 811 and bit line pair BLM, /BLM. Bit line pair BLR, /BLR is connected to sense amplifier and bit line equalize circuit 910 through separation transistor pair 812, 813 and bit line pair BLM, /BLM. Therefore, a sense amplifier in sense amplifier and bit line equalize circuit 910 is shared by bit line pairs BLL, /BLL and BLR, /BLR.

Each input/output gate 815 corresponds to one sense amplifier and bit line equalize circuit 910, and in response to a column select signal CSL, transfers data between bit line pair BLM, /BLM and local input/output line pair LIO, /LIO. The sense amplifier in sense amplifier and bit line equalize circuit 910 amplifies the potential difference between bit lines BLM and /BLM in response to sense amplifier drive signals SON and SOP. A bit line equalize circuit in sense amplifier and bit line equalize circuit 910 supplies a bit line precharge potential (not shown) at the Vcc/2 level to bit lines BLM and /BLM and equalizes the potentials of bit lines BLM and /BLM, in response to a bit line equalize signal (not shown).

A bit line equalize circuit 911 is connected between bit lines BLL and /BLL. Bit line equalize circuit 911 supplies bit line precharge potential VPL at the Vcc level to bit lines BLL and /BLL and equalizes the potentials of bit lines BLL and /BLL, in response to a bit line equalize signal BLEQ. A bit line equalize circuit 912 is connected between bit lines BLR and /BLR. Bit line equalize circuit 912 supplies bit line precharge potential VPL to bit lines BLR and /BLR and equalizes the potentials of bit lines BLR and /BLR, in response to bit line equalize signal BLEQ.

Figure 26:
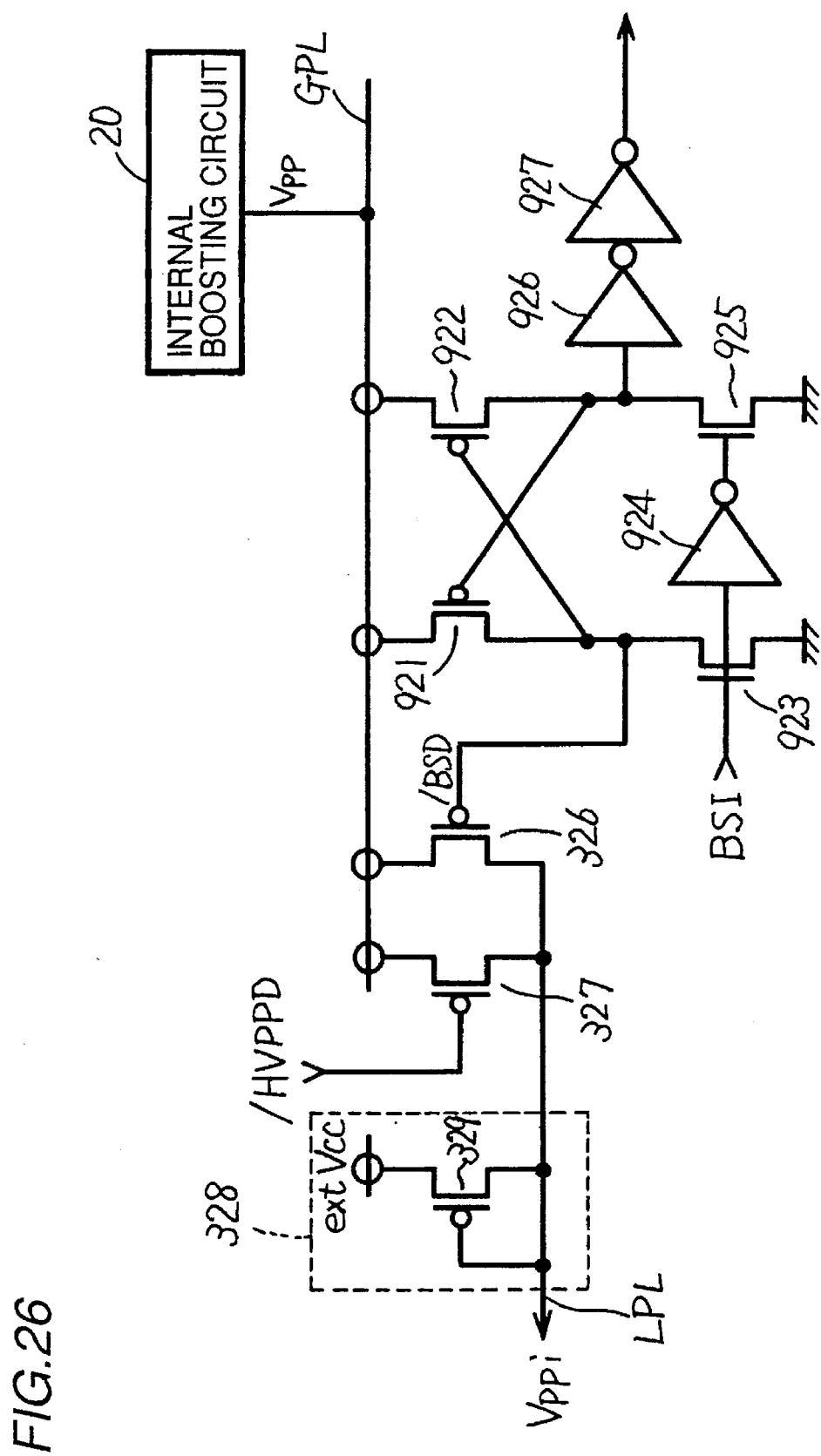
FIG. 26 is a circuit diagram showing a specific structure of one part of one bit line separation driver and the periphery thereof in FIG. 24.
Figure 27:
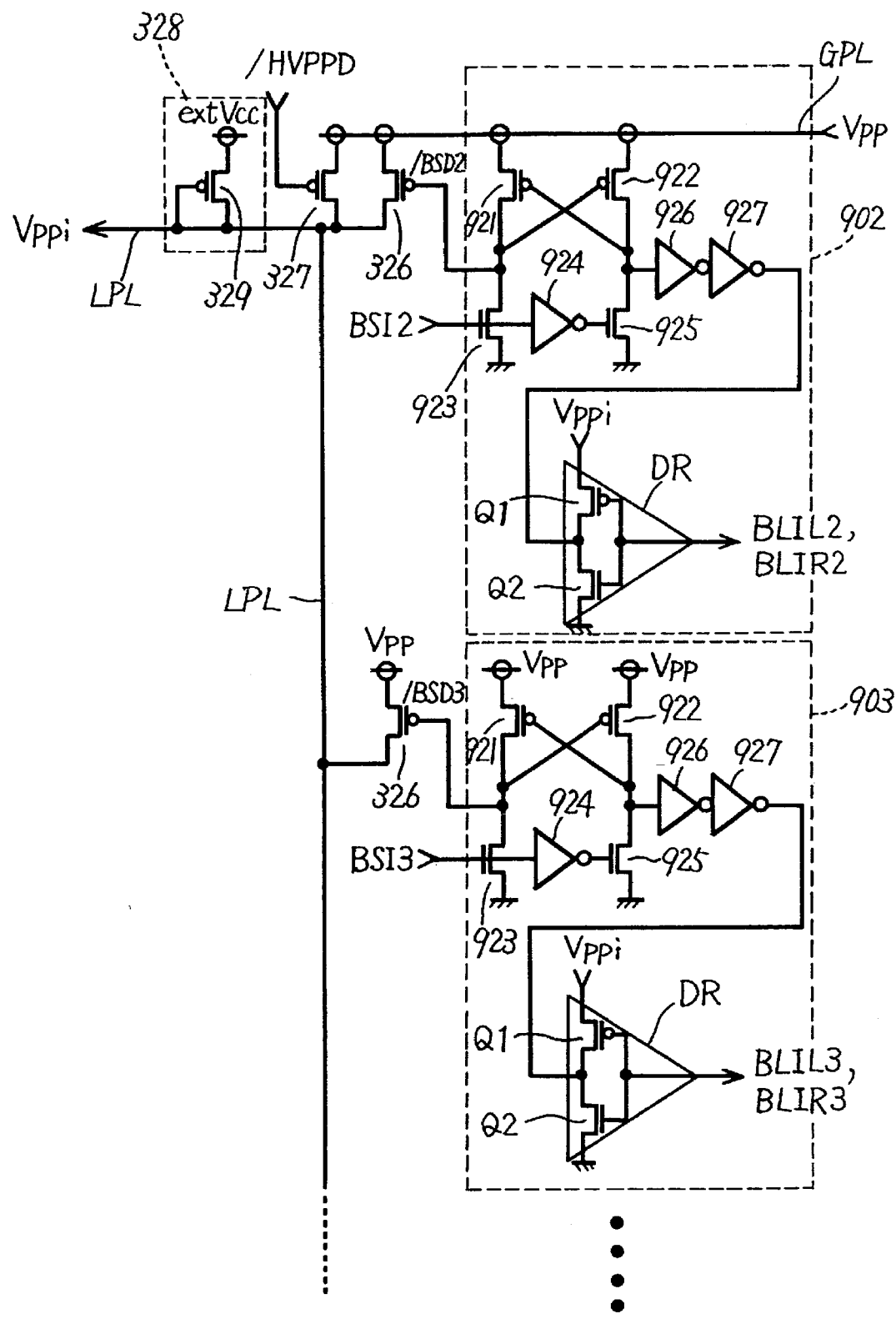
FIG. 27 is a circuit diagram showing a specific structure of two bit lines separation drivers and the periphery thereof in FIG. 24.

FIG. 26 shows the structure of one bit separation driver in FIG. 24, and the structure for making bit line separation drivers 901 to 905 hierarchical. FIG. 27 shows the whole structure of bit line separation drivers 901 and 902 in FIG. 24, and the structure for making the bit line separation drivers hierarchical. Referring to FIGS. 26 and 27, each of bit line separation drivers 901 to 905 includes P channel MOS transistors 921 and 922, N channel MOS transistors 923 and 925, inverters 924, 926 and 927, and a driver (DR1, DR2). Each of bit line separation drivers 901 to 905 generates bit line separation signals BLIL1, BLIR2 and BLIL2 to BLIR4 and BLIL4, and BLIR5 in response to block select signals BSI1 to BSI5, respectively.

Referring to FIG. 26, this semiconductor memory further includes internal boosting circuit 20 generating boosted power supply potential Vpp, global boosted power-line GPL supplied with boosted power supply potential Vpp, local boosted power-line LPL, select transistor 326 connecting local boosted power-line LPL to global boosted power-line GPL in response to block select signal /BSD from the bit line separation driver, precharge transistor 327 connecting local boosted power-line LPL to global boosted power-line GPL in response to hierarchical control signal /HVPPD from a hierarchical Vpp control circuit (30 in FIG. 9), and clamping circuit 328 clamping local boosted power-line LPL to external power supply potential extVcc. As shown in FIG. 27, local boosted power-line LPL is connected to drivers DR in bit line separation drivers 901 to 905.

Operation of this semiconductor memory device will now be described.

First, when none of blocks B1 to B5 is selected, all the bit line separation drivers generate bit line separation signals BLIL1, BLIR2 and BLIL2 to BLIR4 and BLIL4, and BLIR5 at the ground GND level in response to block select signals BSI1 to BSI5 at the L level, respectively. Therefore, all separation transistors 810 to 813 are turned off, whereby all bit line pairs BLL, /BLL and BLR, /BLR are separated from sense amplifier trains 806 to 809. At this time, the bit line equalize circuit in sense amplifier and bit line equalize circuit 910 precharges bit lines BLM and /BLM to the Vcc/2 level in response to the bit line equalize signal. Bit line equalize circuit 911 precharges bit lines BLL and /BLL to the Vcc/2 level in response to the bit line equalize signal. Bit line equalize circuit 912 precharges bit lines BLR and /BLR to the Vcc level in response to the bit line equalize signal. As described above, since bit line equalize circuits 911 and 912 are provided between bit lines BLL and /BLL and between bit lines BLR and /BLR, bit line pairs BLL, /BLL and BLR, /BLR can be precharged even if they are separated from the sense amplifier. Further, bit line separation drivers 901 to 905 generate block select signals /BSD1 to /BSD 5 at the H level in response to block select signals BSI1 to BSI5 at the L level. Since all select transistors 326 are turned off in response to block select signals /BSD1 to /BSD5 at the H level, local boosted power-line LPL is not connected to global boosted power-line GPL. Therefore, boosted power supply potential Vpp is not supplied to any drivers DR through local boosted power-line LPL. As a result, the through current flowing through transistors Q1 and Q2 in driver DR can be reduced. Transistors Q1 and Q2 in driver DR must be increased in size as the number of separation transistors 810, 811 or 812, 813 driven by one driver DR increases. Therefore, the larger the number of separation transistors 810, 811 or 812, 813 driven by one driver DR, the more effectively the through current can be reduced.

When block B3 is selected for example, only block select signal BSI3 is activated to the H level. Bit line separation driver 903 activates block select signal /BSD3 to the L level in response to block select signal BSI3 at the H level. Select transistor 326 of block B3 is turned on in response to block select signal /BSD3 at the L level, whereby boosted power supply potential Vpp of global boosted power-line GPL is supplied to local boosted power-line LPL. Therefore, bit line separation driver 903 supplies potential Vppi of local boosted power-line LPL to the gate electrodes of separation transistors 810 to 813 on both sides of block B3 in response to block select signal BSI3 at the H level. More specifically, only bit line separation signals BLIL3 and BLIR3 attain the Vpp level.

As described above, since a bit line separation signal at the Vpp level is applied only to select transistors on both sides of the selected block, and a bit line separation signal at the GND level is applied to the other separation transistors, the through current flowing through driver DR may substantially be reduced. As a result, the load of internal boosting circuit 20 can be made smaller than that of the above described conventional internal boosting circuit.

Further, precharge transistor 327 turned on/off in response to hierarchical control signal /HVPPD is provided in Embodiment 10. Therefore, as in the above described embodiments, local boosted power-line LPL is precharged to the Vpp level during the power on reset period. As a result, bit line separation signal BLI can be activated immediately after the power on reset period.

Further, clamping circuit 328 is provided in Embodiment 10. Therefore, even if a state in which none of blocks B1 to B5 is selected lasts long, potential Vppi of local boosted power-line LPL does not substantially decrease from boosted power supply potential Vpp, as in the above embodiments.

Embodiment 11

Figure 28:
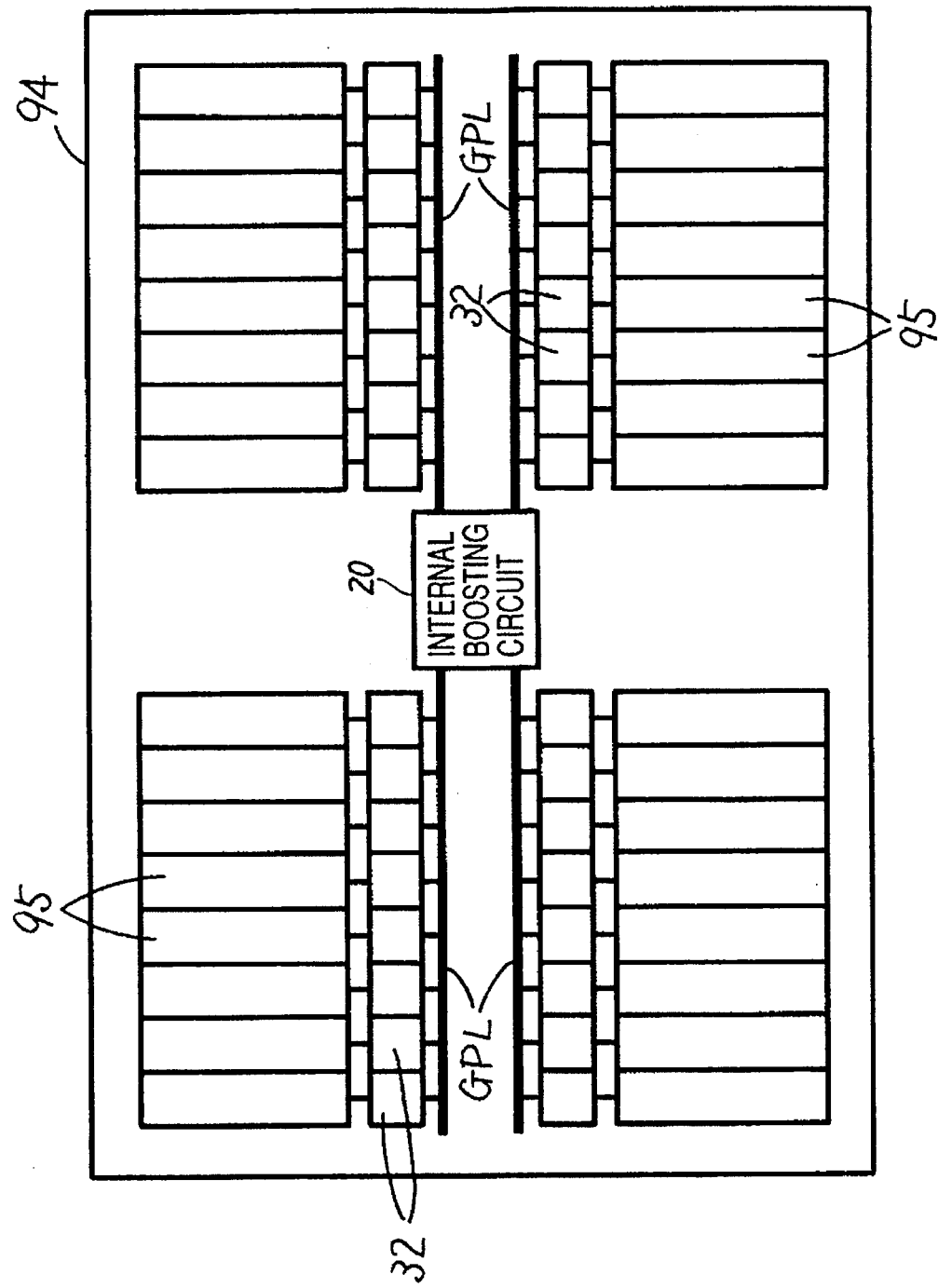
FIG. 28 is a layout diagram showing the whole structure of a DRAM according to Embodiment 11 of the present invention.

Referring to FIG. 28, a semiconductor memory device 94 includes internal boosting circuit 20 generating boosted power supply potential Vpp, global boosted power-line GPL supplied with boosted power supply potential Vpp, a plurality of blocks 95 which can selectively be activated, and hierarchical Vpp circuits 32 provided corresponding to plural blocks 95 for each connecting corresponding block 95 to global boosted power-line GPL in response to block select signal BSI.

Figure 29:
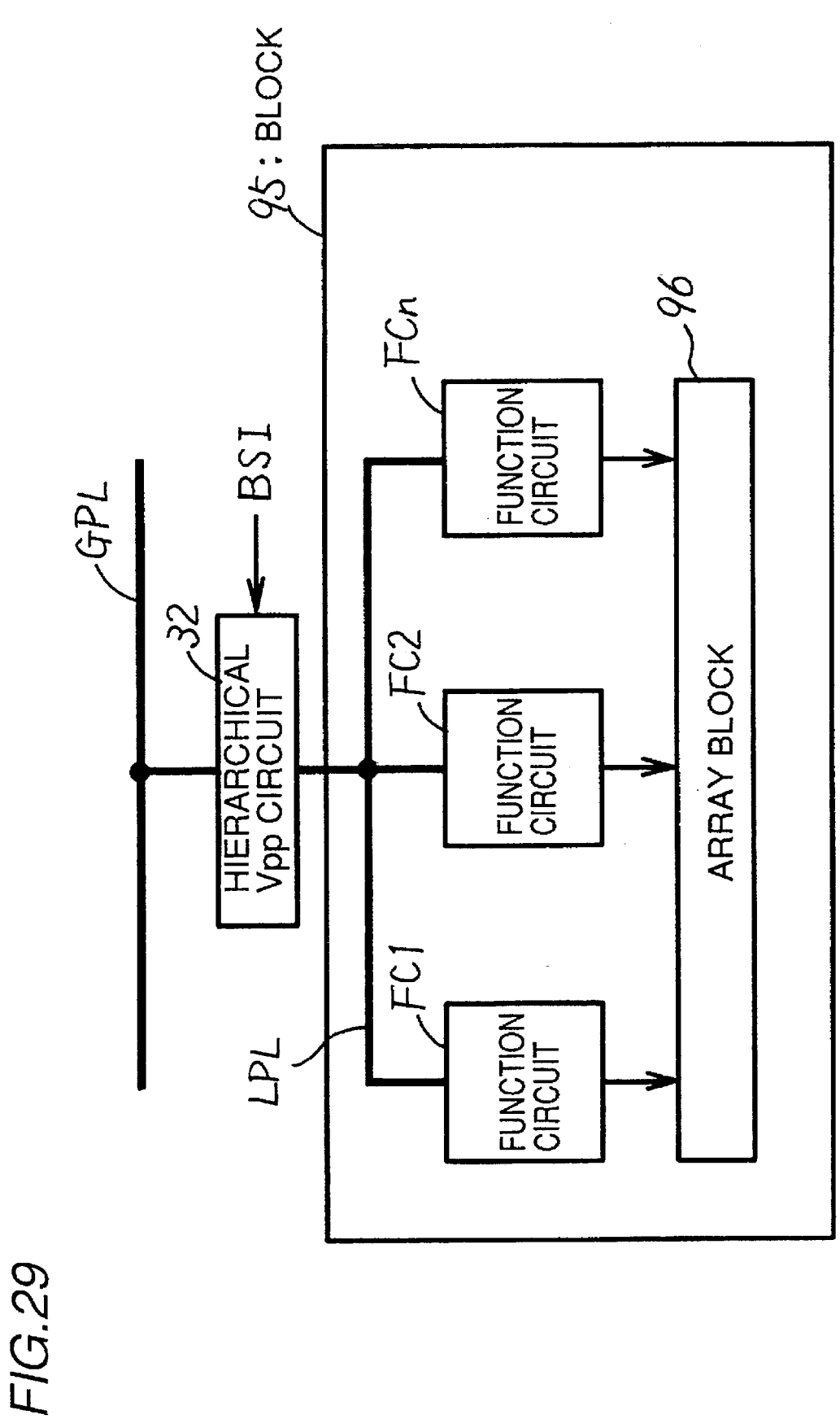
FIG. 29 is a block diagram showing a specific structure of one block in FIG. 28.
Figure 30:
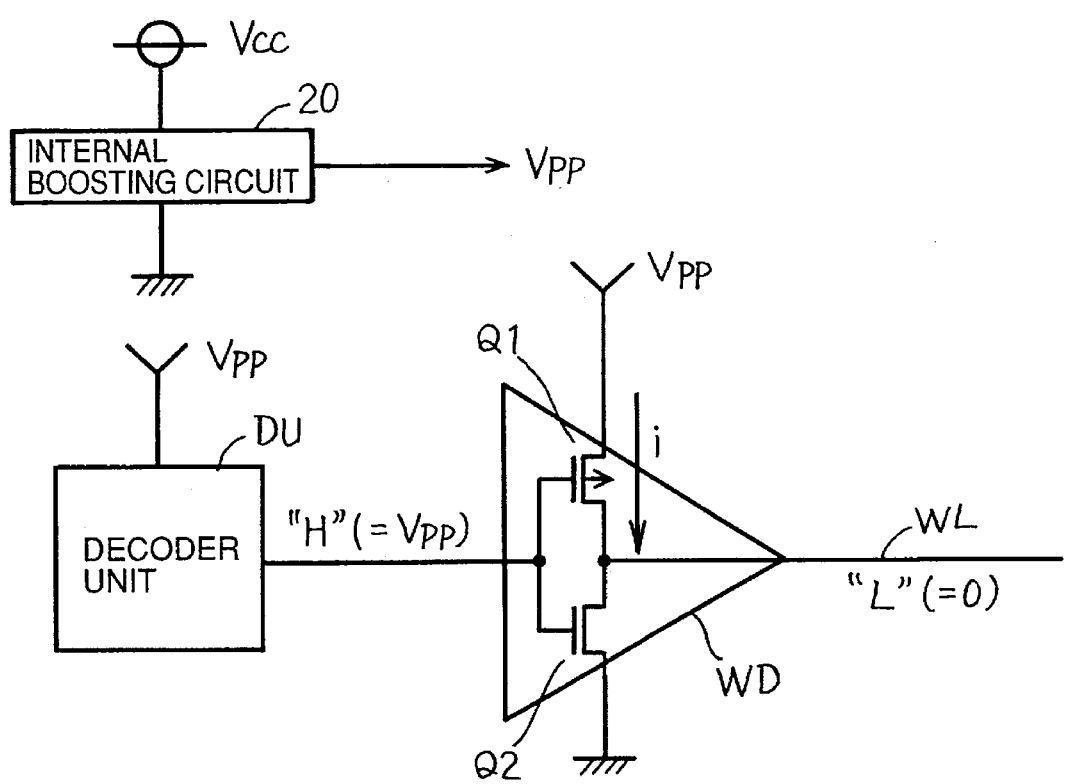
FIG. 30 is a block diagram showing an internal boosting circuit, a decoder unit, and a word line driver used in the conventional DRAM.
Figure 31:
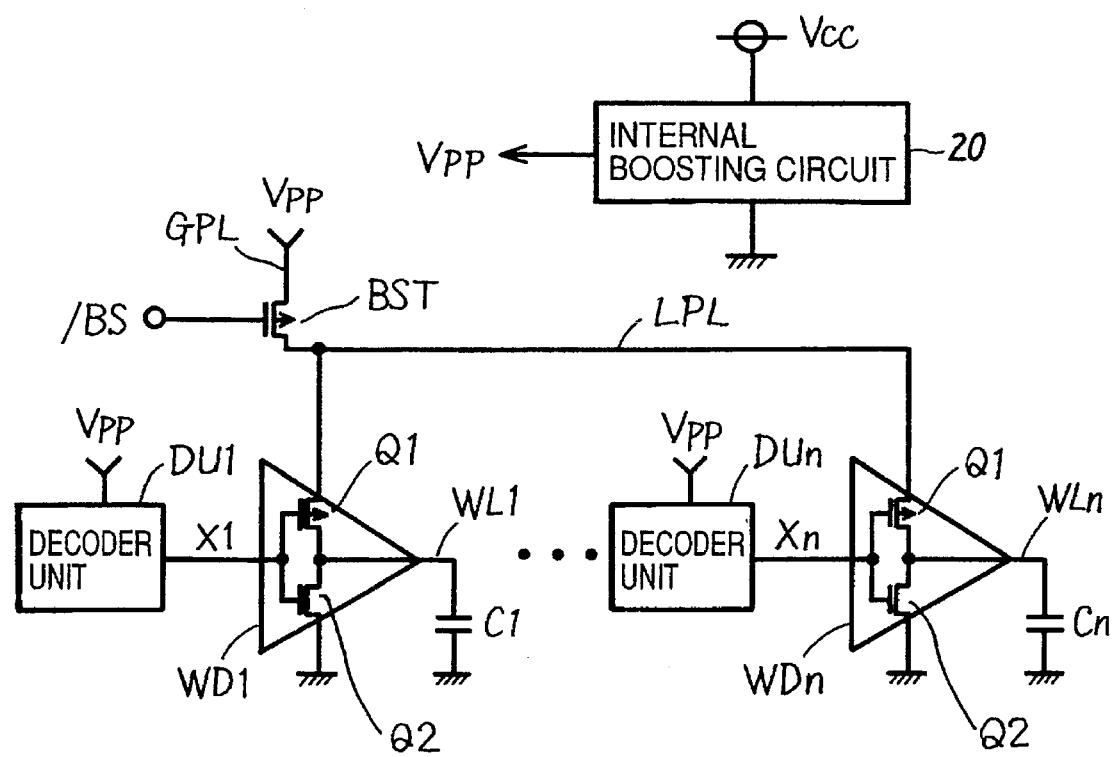
FIG. 31 is a block diagram showing a main structure of the conventional DRAM having a hierarchical boosted power-line scheme.

Referring to FIG. 29, each block 95 includes local boosted power-line LPL which can be connected to global boosted power-line GPL through hierarchical Vpp circuit 32, n function circuits FC1 to FCn connected together to local boosted power-line LPL, and an array block 96 controlled by function circuits FC1 to FCn. For example, function circuit FC1 includes a word line driver and the like, and function circuit FC2 includes a bit line separation driver and the like. More specifically, in Embodiment 11, boosted power supply potential Vpp is not made hierarchical for each word line driving system or each separation transistor driving system. In Embodiment 11, boosted power supply potential Vpp is made hierarchical for the entire system including a plurality of function circuits FC1 to FCn such as the word line driving system and the separation transistor driving system.

Operation of this semiconductor memory device will now be described. When none of blocks 95 is selected, local boosted power-lines LPL in all blocks 95 are separated from global boosted power-line GPL in response to block select signal BSI at the L level. Therefore, even if function circuit FC1, for example, includes a number of word line drivers, the through current flowing in the word line drivers is substantially reduced.

When any of blocks 95 is selected, local boosted power-line LPL in the selected block 95 is connected to global boosted power-line GPL in response to a block select signal at the H level. However, local boosted power-lines LPL in non-selected blocks 95 are not connected to global boosted power-line GPL. Therefore, even if function circuit FC1, for example, includes a number of word line drivers, the amount of through current flowing through the word line drivers is substantially reduced. Note that boosted power supply potential Vpp may further be made hierarchical in each function circuit.

Although the present invention has been described and illustrated in detail, it is clearly understood that the same is by way of illustration and example only and is not to be taken byway of limitation, the spirit and scope of the present invention being limited only by the terms of the appended claims.

What is claimed is:

1. A semiconductor memory device, comprising:
   boosted power supply potential generating means for generating, based on an external power supply potential, a predetermined boosted power supply potential higher than said external power supply potential;
   a global power-line supplied with said boosted power supply potential from said boosted power supply potential generating means;
   a plurality of word lines;
   a plurality of bit lines crossing said word lines;
   a plurality of memory cells corresponding to crossing points of said word lines and said bit lines and each coupled to a corresponding word line and a corresponding bit line;
   a local power-line;
   connecting means responsive to a predetermined select signal for connecting said local power-line to said global power-line;
   a plurality of word line driving means corresponding to said word lines, connected to said local power-line in common and each for supplying said boosted power supply potential of said local power-line to a corresponding word line to drive the corresponding word line;
   activating means responsive to an externally supplied row address signal for selectively activating said word line driving means; and
   power on reset signal generating means responsive to supply of said external power supply potential for generating a power on reset signal for a predetermined period, wherein said connecting means further connects said local power-line to said global power-line in response to said power on reset signal.

2. The semiconductor memory device according to claim 1, further comprising supplying means for generating an initialize signal activated in response to activation of said power on reset signal and deactivated a predetermined period after deactivation of said power on reset signal to supply the generated initialize signal to said connecting means.

3. The semiconductor memory device according to claim 1, wherein said connecting means includes
a logic gate responsive to said select signal and said power on reset signal for supplying an output signal, and
a transistor connected between said local power-line and said global power-line and turned on/off in response to said output signal of said logic gate.

4. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a plurality of blocks each including
(a) a plurality of word lines,
(b) a plurality of bit lines crossing said word lines,
(c) a plurality of memory cells corresponding to crossing points of said word lines and said bit lines and each coupled to a corresponding word line and a corresponding bit line,
(d) a local power-line,
(e) connecting means responsive to a predetermined select signal for connecting said local power-line to said global power-line, and
(f) a plurality of word line driving means corresponding to said word lines, connected to said local power-line in common and each for supplying said boosted power supply potential of said local power-line to a corresponding word line to drive the corresponding word line;

activating means responsive to an externally supplied row address signal for selectively activating said word line driving means; and power on reset signal generating means responsive to supply of said external power supply potential for generating a power on reset signal for a predetermined period, wherein said connecting means further connects said local power-line to said global power-line in response to said power on reset signal.

5. The semiconductor memory device according to claim 4, further comprising supplying means for generating an initialize signal activated in response to activation of said power on reset signal and deactivated a predetermined period after deactivation of said power on reset signal to supply the generated initialize signal to said connecting means.

6. The semiconductor memory device according to claim 5, wherein said supplying means includes
counter means for counting a predetermined control signal externally supplied after deactivation of said power on reset signal to generate a carry signal when the number of counted control signals reaches a predetermined number, and
initialize signal generating means for activating said initialize signal in response to said power on reset signal and deactivating said initialize signal in response to said carry signal.

7. The semiconductor memory device according to claim 6, wherein said control signal includes an address strobe signal for strobing an externally supplied address signal.

8. The semiconductor memory device according to claim 5, wherein said supplying means includes
detecting means for detecting a potential of said global power-line to generate a boost enable signal for activating said boosted power supply potential generating means when the detected potential does not attain said boosted power supply potential, and
initialize signal generating means for activating said initialize signal in response to activation of said power on reset signal and deactivating said initialize signal in response to activation of said boost enable signal.

9. The semiconductor memory device according to claim 8, wherein said initialize signal generating means includes
a flip-flop circuit set in response to said power on reset signal and reset in response to said boost enable signal for supplying said initialize signal.

10. The semiconductor memory device according to claim 4, wherein said connecting means includes
a logic gate responsive to said select signal and said power on reset signal for supplying an output signal, and
a transistor connected between said local power-line and said global power-line turned on/off in response to said output signal of said logic gate.

11. The semiconductor memory device according to claim 4, wherein each of said blocks further includes
a block select decoder responsive to said row address signal for generating said select signal.

12. The semiconductor memory device according to claim 4, wherein said power on reset signal generating means includes
capacitive means,
charging means for supplying said external power supply potential to said capacitive means to charge said capacitive means, and
means for generating said power on reset signal until a charge voltage of said capacitive means reaches a predetermined voltage.

13. The semiconductor memory device according to claim 4, further comprising internal power supply potential generating means for generating, based on said external power supply potential, a predetermined internal power supply potential lower than said external power supply potential, wherein said power on reset signal generating means receives said internal power supply potential.

14. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a local power-line;

connecting means responsive to a predetermined select signal for connecting said local power-line to said global power-line;

a function circuit connected to said local power-line for carrying out a predetermined operation; and potential supplying means receiving a predetermined clamp potential other than said boosted power supply potential for supplying said clamp potential to said local power-line when the potential of said local power-line is lower than said clamp potential.

15. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a local power-line;

first connecting means responsive to a predetermined select signal for connecting said local power-line to said global power-line;

a function circuit connected to said local power-line for carrying out a predetermined operation; and second connecting means responsive to a test enable signal activated in a test mode for connecting said local power-line to said global power-line.

16. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means; and a plurality of blocks each including
  (a) a plurality of local power-lines,
  (b) a plurality of function circuits provided corresponding to said plurality of local power-lines, activated in response to a predetermined select signal, and each connected to a corresponding local power-line for carrying out a predetermined operation, and
  (c) a plurality of connecting means provided corresponding to said plurality of local power-lines for each connecting a corresponding local power-line to said global power-line in response to said select signal.

17. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a plurality of blocks each including
  (a) a local power-line, and
  (b) a function circuit connected to said local power-line for carrying out a predetermined operation; and connecting means responsive to a predetermined select signal for connecting the local power-lines in said plurality of blocks to said global power-line.

18. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a local power-line;

connecting means responsive to a predetermined select signal for connecting said local power-line to said global power-line;

a bit line pair;

a sense amplifier for amplifying a potential difference of said bit line pair;

a transistor pair connected between said bit line pair and said sense amplifier; and transistor driving means connected to said local power-line for driving said transistor pair by supplying said boosted power supply potential of said local power-line to the gates of said transistor pair.

19. A semiconductor memory device, comprising:

boosted power supply potential generating means for generating, based on an external power supply potential, a predetermined boosted power supply potential higher than said external power supply potential;

a global power-line supplied with said boosted power supply potential from said boosted power supply potential generating means;

a local power-line;

connecting means responsive to a predetermined select signal for connecting said local power-line to said global power-line;

a first function circuit connected to said local power-line and receiving said boosted power supply potential of said local power-line to carry out a first operation; and a second function circuit connected to said local power-line and receiving said boosted power supply potential of said local power-line for carrying out a second operation different from said first operation.

* * * * *